US012598979B2

(12) United States Patent
Narayan et al.

(10) Patent No.: US 12,598,979 B2
(45) Date of Patent: Apr. 7, 2026

(54) DUAL CONTACT AND POWER RAIL FOR HIGH PERFORMANCE STANDARD CELLS

(71) Applicant: Apple Inc., Cupertino, CA (US)

(72) Inventors: Sambasivan Narayan, Campbell, CA (US); Praveen Raghavan, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 952 days.

(21) Appl. No.: 17/655,716

(22) Filed: Mar. 21, 2022

(65) Prior Publication Data

US 2023/0299001 A1     Sep. 21, 2023

(51) Int. Cl.
H01L 23/528 (2006.01)
H10D 64/23 (2025.01)

(52) U.S. Cl.
CPC ....... H01L 23/5286 (2013.01); H10D 64/254 (2025.01)

(58) Field of Classification Search
CPC . H01L 23/5286; H01L 23/485; H10D 64/254; H10D 30/43; H10D 30/6735; H10D 30/6757; H10D 62/121; H10D 84/834; H10D 84/83; H10D 89/10; H10B 10/12; B82Y 10/00
See application file for complete search history.

(56) References Cited

U.S. PATENT DOCUMENTS 8,174,124 B2 * 5/2012 Chiu ................... H01L 21/6835
257/E23.101
9,754,887 B2 9/2017 Kim 9,793,211 B2 10/2017 Peng et al.
10,074,570 B2 9/2018 Anderson et al.
10,424,577 B2 9/2019 Lee et al.
2015/0162448 A1 6/2015 Raghavan et al.
(Continued)

FOREIGN PATENT DOCUMENTS

EP          3324436 A1    5/2018
JP        2010-171166 A    8/2010
(Continued)

OTHER PUBLICATIONS

Office Action in Taiwanese Appl. No. 112110521 mailed Jan. 12, 2024, 7 pages.
(Continued)

*Primary Examiner* — Ida M Soward
(74) *Attorney, Agent, or Firm* — Kowert, Hood, Munyon, Rankin & Goetzel, P.C.; Gareth M. Sampson; Dean M. Munyon

(57)          ABSTRACT

A standard cell layout that may be implemented in FinFET devices or nanosheet FET devices is disclosed. The standard cell layout includes power supply connections from both a topside metal layer and a backside metal layer. A device in the standard cell may be connected to both the topside metal layer and the backside metal layer. Source/drain regions of the device may be connected the metal layers using via contacts within the standard cell layout. Connections to power supply rails from the topside metal layer and the backside metal layer may also be included in the standard cell layout. The rails may be connected to a power supply such that the power supply provides power to the device through both the topside and backside metal layers.

20 Claims, 20 Drawing Sheets

(56) References Cited

U.S. PATENT DOCUMENTS

| | | | |
|---|---|---|---|
| 2015/0333056 A1 | 11/2015 | Du et al. | |
| 2016/0247569 A1 | 8/2016 | Nii | |
| 2017/0062421 A1 | 3/2017 | Cosemans et al. | |
| 2017/0110461 A1 | 4/2017 | Fujiwara et al. | |
| 2017/0243650 A1 | 8/2017 | Ogawa et al. | |
| 2017/0294448 A1 | 10/2017 | Debacker et al. | |
| 2018/0061766 A1 | 3/2018 | Goktepeli | |
| 2018/0145030 A1 | 5/2018 | Beyne et al. | |
| 2018/0174642 A1 | 6/2018 | Huynh Bao et al. | |
| 2018/0175193 A1 | 6/2018 | Raghavan et al. | |
| 2019/0043564 A1 | 2/2019 | Madraswala et al. | |
| 2019/0259699 A1 | 8/2019 | Morrow et al. | |
| 2019/0287863 A1 | 9/2019 | Xie et al. | |
| 2019/0378790 A1 | 12/2019 | Bohr et al. | |
| 2019/0386026 A1 | 12/2019 | Molin et al. | |
| 2020/0006378 A1 | 1/2020 | Huo | |
| 2020/0006429 A1 | 1/2020 | McCollum et al. | |
| 2020/0135645 A1 | 4/2020 | Rubin et al. | |
| 2020/0327274 A1 | 10/2020 | Chen et al. | |
| 2021/0027005 A1 | 1/2021 | Yuan et al. | |
| 2021/0242870 A1 | 8/2021 | Kim et al. | |
| 2021/0305262 A1 | 9/2021 | Wang et al. | |
| 2021/0343332 A1* | 11/2021 | Chiu | H10D 30/62 |
| 2021/0351079 A1* | 11/2021 | Su | H10D 84/0128 |
| 2021/0358850 A1* | 11/2021 | Chen | H01L 23/5385 |
| 2021/0358901 A1 | 11/2021 | Liu | |
| 2021/0391318 A1 | 12/2021 | Peng et al. | |
| 2021/0391464 A1 | 12/2021 | Bae et al. | |
| 2022/0037340 A1 | 2/2022 | Yang et al. | |
| 2022/0122971 A1* | 4/2022 | Peng | H01L 21/02532 |
| 2022/0123023 A1* | 4/2022 | Peng | H10D 86/441 |
| 2022/0165659 A1* | 5/2022 | Huang | H01L 21/76849 |
| 2022/0199624 A1* | 6/2022 | Huang | H10B 53/30 |
| 2022/0223514 A1 | 7/2022 | Sisodia et al. | |
| 2022/0262731 A1 | 8/2022 | Park et al. | |
| 2022/0359491 A1* | 11/2022 | Chen | H01L 23/528 |
| 2022/0399402 A1* | 12/2022 | Leng | H10K 10/82 |
| 2023/0061857 A1* | 3/2023 | Lin | H10D 84/038 |
| 2023/0067140 A1 | 3/2023 | Chen et al. | |
| 2023/0067715 A1* | 3/2023 | Yuh | H10D 30/6729 |
| 2023/0068280 A1* | 3/2023 | Lin | H10D 30/6729 |
| 2023/0197612 A1 | 6/2023 | Majhi et al. | |
| 2023/0207465 A1 | 6/2023 | Wei et al. | |
| 2023/0215767 A1* | 7/2023 | Xie | H10D 30/43 257/329 |
| 2023/0292631 A1* | 9/2023 | Lee | H10N 50/85 |
| 2024/0070365 A1 | 2/2024 | Alptekin et al. | |
| 2024/0381610 A1 | 11/2024 | Wang et al. | |
| 2025/0212377 A1 | 6/2025 | Chang et al. | |
| 2025/0240937 A1 | 7/2025 | Liaw | |

FOREIGN PATENT DOCUMENTS

| | | | | |
|---|---|---|---|---|
| JP | A 2016-517625 A | 6/2016 | | |
| JP | 2017-511596 A | 4/2017 | | |
| KR | 20250043550 A | 3/2025 | | |
| TW | 315468 B | 9/1997 | | |
| TW | 201240015 A | 10/2012 | | |
| TW | 201532125 A | 8/2015 | | |
| TW | 201539469 A | 10/2015 | | |
| TW | 201543662 A | 11/2015 | | |
| TW | 201606895 A | 2/2016 | | |
| TW | 201730970 A | 9/2017 | | |
| TW | 201816982 A | 5/2018 | | |
| TW | 201933578 A | 8/2019 | | |
| TW | 202027184 A | 7/2020 | | |
| TW | 202103161 A | 1/2021 | | |
| TW | 202145310 A | 12/2021 | | |
| TW | 202145524 A | 12/2021 | | |
| TW | 202213791 A | 4/2022 | | |
| TW | 202217976 A | 5/2022 | | |
| WO | WO-2018106267 A1 * | 6/2018 | | G06F 17/5072 |
| WO | 2021/124000 A1 | 6/2021 | | |
| WO | 2024049617 A1 | 3/2024 | | |

OTHER PUBLICATIONS

Office Action in Taiwanese Appl. No. 113129928 mailed Jan. 13, 2025, 9 pages.
Office Action in Taiwanese Appl. No. 112110519 mailed May 21, 2024, 5 pages.
International Search Report and Written Opinion in PCT Appl. No. PCT/US2023/014068 mailed Jun. 27, 2023, 11 pages.
Extended European Search Report in Appl. No. 23775442.9 mailed Dec. 23, 2025, 7 pages.

* cited by examiner

300

To
VDD

308

304

306

4

4

304

306

308

302A    302B    302C

To
VSS

Gates 302

Device 304

Backside Vias
(from bottom)
306

Backside Metal
Layers 308

Device
304

300

Memory Array 1500

Memory Array 1600

Memory Array 1700

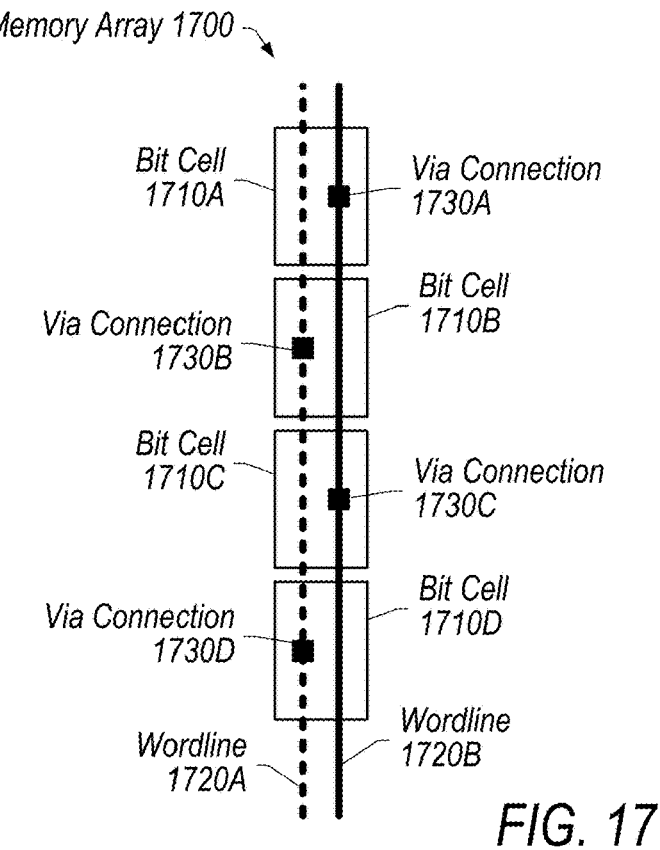

Bit Cell
1710A

Via Connection
1730A

Via Connection
1730B

Bit Cell
1710B

Bit Cell
1710C

Via Connection
1730C

Via Connection
1730D

Bit Cell
1710D

Wordline
1720A

Wordline
1720B

*FIG. 17*

Memory Array 1800

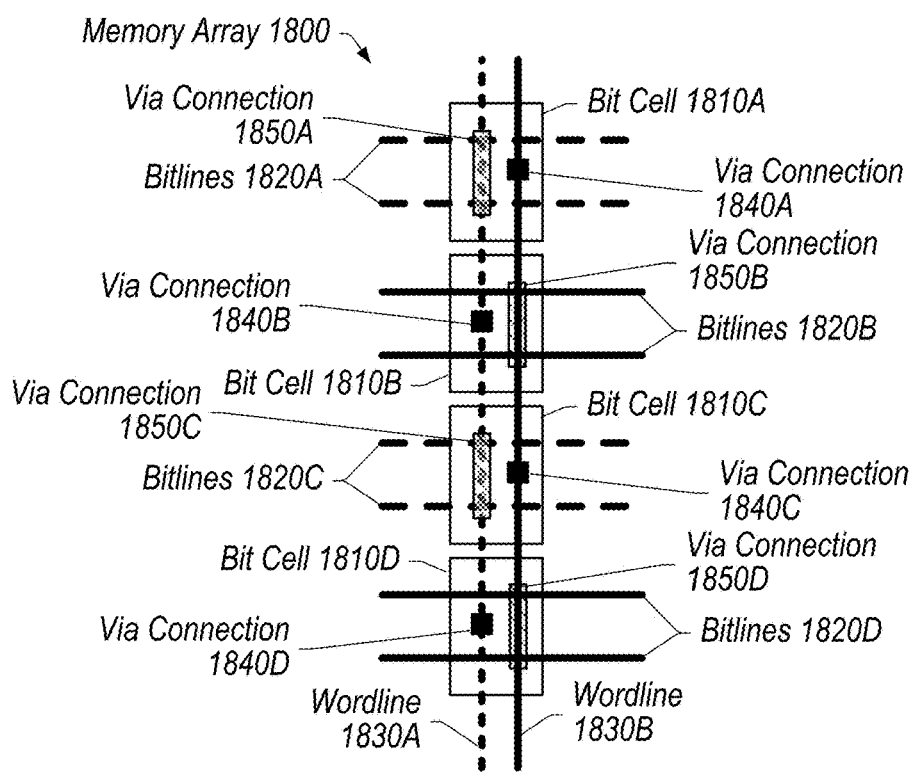

Via Connection
1850A

Bit Cell 1810A

Bitlines 1820A

Via Connection
1840A

Via Connection
1840B

Via Connection
1850B

Bitlines 1820B

Via Connection
1850C

Bit Cell 1810B

Bit Cell 1810C

Bitlines 1820C

Via Connection
1840C

Bit Cell 1810D

Via Connection
1850D

Via Connection
1840D

Bitlines 1820D

Wordline
1830A

Wordline
1830B

*FIG. 18*

DUAL CONTACT AND POWER RAIL FOR HIGH PERFORMANCE STANDARD CELLS

BACKGROUND

Technical Field

Embodiments described herein relate to semiconductor devices. More particularly, embodiments described herein relate to layouts for making connections to transistors on semiconductor substrates.

Description of the Related Art

Standard cells are groups of transistors, passive structures, and interconnect structures that can provide logic functions, storage functions, etc. Current trends in standard cell methodology are towards reducing the size of standard cells while increasing the complexity (e.g., circuit density and number of components) within standard cells. As standard cell designs become smaller, however, it becomes more difficult to provide access (e.g., connections) to components within the standard cells.

Additionally, performance of standard cells may become more affected by properties within the cell as the size of standard cells decreases. For example, resistances within a standard cell, such as in metal traces or interfaces between diffusion regions and metal traces in the cell, may reduce performance of the cell with the effect on performance becoming more of an issue as the cell becomes smaller. Thus, reducing resistances within a standard cell may increase performance of the cell.

BRIEF DESCRIPTION OF THE DRAWINGS

Features and advantages of the methods and apparatus of the embodiments described in this disclosure will be more fully appreciated by reference to the following detailed description of presently preferred but nonetheless illustrative embodiments in accordance with the embodiments described in this disclosure when taken in conjunction with the accompanying drawings in which:

FIG. 17 depicts a top-view representation of a memory array showing bit cells and wordlines, according to some embodiments.

FIG. 18 depicts a top-view representation of a memory array with both bitlines and wordlines in topside and backside metal layers, according to some embodiments.

Figure 1:
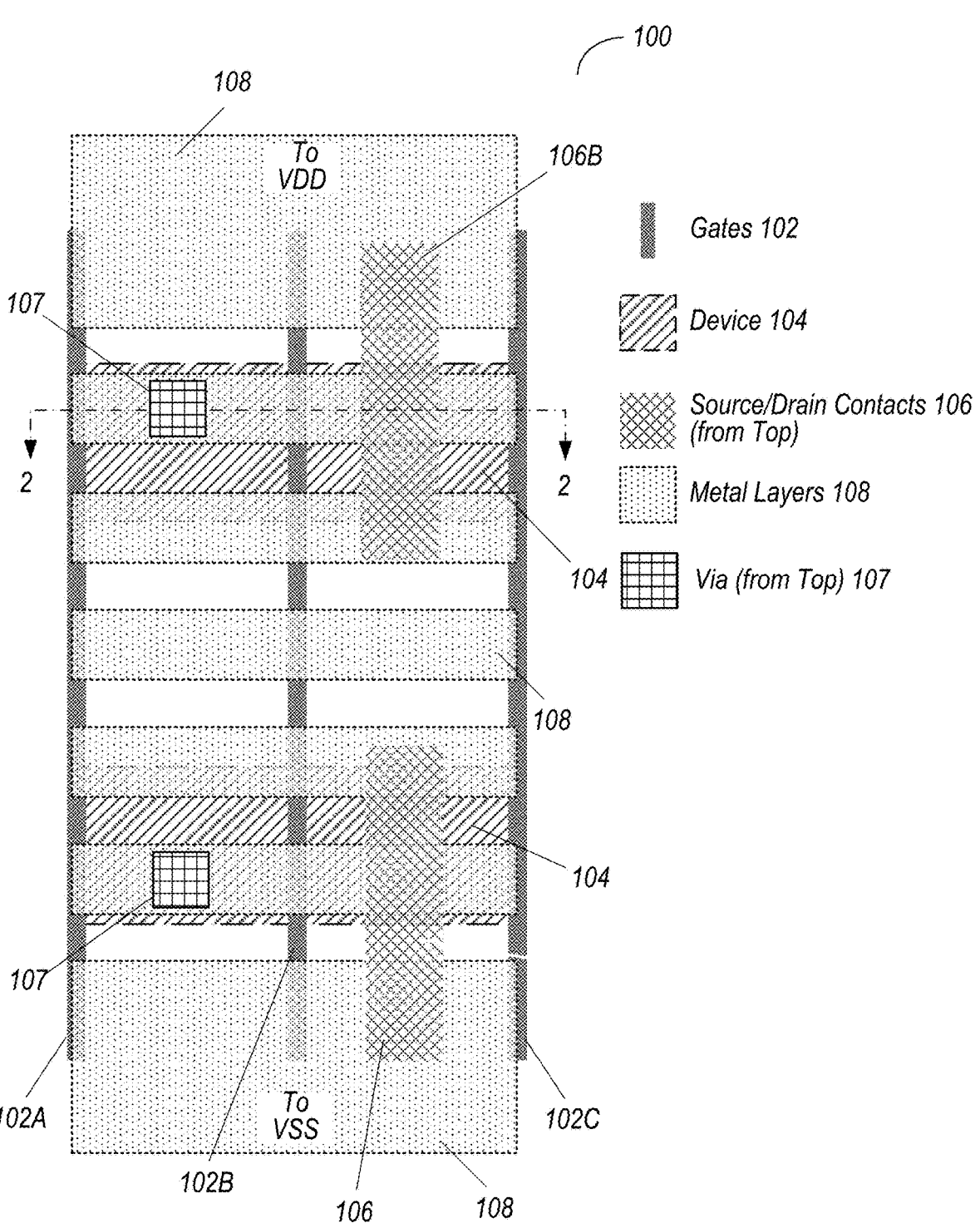
FIG. 1 depicts a top-view representation of an embodiment of a standard cell with topside connections.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

DETAILED DESCRIPTION OF EMBODIMENTS

The present disclosure is directed to the utilization of backside metal layers for providing power and/or control signal connections to transistors in integrated circuit cells (such as standard cells). As used herein, the term "standard cell" refers to a group of transistor structures, passive structures, and interconnect structures formed on a substrate to provide logic or storage functions that are standard for a variety of implementations. Integrated circuit cells may also include custom circuit design cells that are individually designed for a particular implementation. Many current designs of cells provide connections and routing for power or signals to transistors (or other structures) above the transistors. For example, the connections and routing for power or signals may be provided in topside layers of the device (e.g., layers above the active layer of transistors in the device when viewed in a typical cross-sectional view). As used herein, the term "topside" refers to areas in a device that are vertically above an active layer of the device (e.g., above a transistor region of the device). For example, topside may refer to components such as contacts or layers that are above a transistor region in a vertical dimension, as depicted in the figures and described herein. In some instances, the term "frontside" may be used interchangeably with the term "topside".

FIG. 1 depicts a top-view representation of an embodiment of standard cell 100 with topside connections. For simplicity in the drawings, only components relevant to the disclosure are shown in the representations of a cell disclosed herein. A person with knowledge in the art would understand that additional components may be present in any of the cells depicted herein.

In the illustrated embodiment of FIG. 1, standard cell 100 includes gates 102, device 104, source/drain contacts 106 and metal layer 108. Gates 102 (e.g., gates 102A, 102B, 102C) may be poly lines (e.g., polysilicon layers or metal layers). In various embodiments, the illustrations of gates in the present disclosure include gate spacers 103. Device 104 may be, for example, a transistor such as a FinFET device, a nanosheet FET (NSH) device, or a GAAFET ("gate-all-around" FET) device. Other embodiments of transistor devices may also be contemplated. In various embodiments, contacts 106 or vias 107 provide connection between device 104 and metal layers 108. Metal layers 108 may include one or more metal layers with contacts 106 and vias 107 providing various connections to different metal layers in embodiments with multiple metal layers. For instance, contacts 106 may provide connections between regions in device 104 (e.g., source/drain regions in the device) and a first metal layer (e.g., ground metal layer) while vias 107 provide connections between regions in the device and other higher metal layers (e.g., layers above the first metal layer). In certain embodiments, metal layers 108 provide routing from device 104 to Vdd (e.g., the supply voltage) and Vss (e.g., ground). Metal layer 108 may also provide routing for connections to control signals to/from device 104, as described herein.

Figure 2:
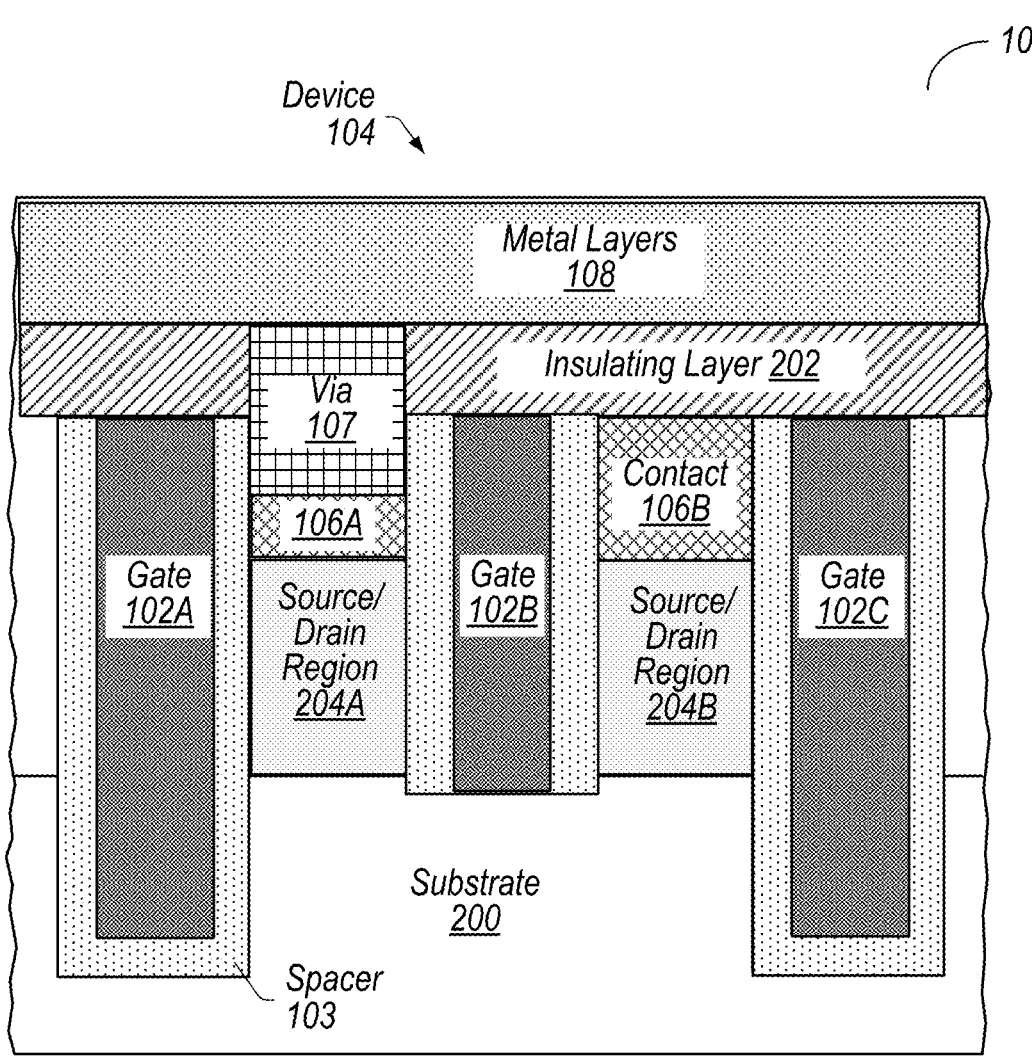
FIG. 2 depicts a cross-sectional representation of an embodiment of a standard cell along the sectional lines shown in FIG. 1.

FIG. 2 depicts a cross-sectional representation of the embodiment of standard cell 100 along the sectional lines shown in FIG. 1, according to some embodiments. In the illustrated embodiment, standard cell 100 includes substrate 200 with insulating layer 202 formed above gates 102. In some embodiments, as shown in FIG. 2, gate 102B is an active gate while gates 102A and 102C are isolation gates on either side of the active gate. In certain embodiments, substrate 200 is a silicon substrate and insulating layer 202 is an oxide layer. In various embodiments, substrate 200 may include additional components or features for implementation in device 104. For instance, substrate 200 may include insulating layers, diffusion (e.g., oxide diffusion) regions, or doped regions for implementation in device 104.

For simplicity in the drawing, substrate 200 and insulating layer 202 are depicted as single layers. In some embodiments, insulating layer 202 includes one or more insulating layers formed above the substrate. For example, substrate 200 may be a silicon substrate with one or more oxide layers formed above the substrate. Insulating layer 202 may include a single insulating layer or multiple insulating layers. For instance, insulating layer 202 may include multiple oxide layers. In various embodiments, insulating layer 202 that at least partially surrounds or encapsulates the regions of device 104 (e.g., gates 102, source/drain regions 204, contacts 106, etc.).

In certain embodiments, as shown in FIG. 2, source/drain regions 204 of device 104 are positioned above substrate 200 in standard cell 100. Source/drain regions 204 may be, for example, fins or nanosheet stacks in FinFETs or NSH devices. Various embodiments may also be contemplated where source/drain regions 204 are in substrate 200, or portions of the source/drain regions are in the substrate.

As shown in FIG. 2, contacts 106, via 107, and metal layers 108 are in topside layers of device 104 above source/drain regions 204 and gates 102. In various embodiments, vias 107 provide signal connections to source/drain region 204A while contacts 106 provide power signal connections to source/drain region 204B. For instance, in the illustrated embodiments of FIGS. 1 and 2, contact 106B connects source/drain region 204B to Vdd through routing in metal layers 108 (note that contact 106B extends horizontally from device 104 to the portion of metal layers 108 coupled to Vdd, as shown in FIG. 1) while via 107 connects (through contact 106A) source/drain region 204A to signal routing in metal layers 108. Accordingly, metal layers 108 may include routing for both power connections and control signal connections. As shown in FIGS. 1 and 2, providing connections and routing for both power and control signals above device 104 using contacts 106 and vias 107 may have an area cost above the device in standard cell 100.

Some contemplated embodiments for designs of standard cells move connections and routing for power connections to metal layers below the transistors. For example, the connections and routing for power may be provided in the backside layers of the device (e.g., layers below the active layer of transistors in the device when viewed in a typical cross-sectional view). As used herein, the term "backside" refers to areas in a device that are vertically below an active layer of the device (e.g., below a transistor region of the device). For example, backside may refer to components such as contacts or layers that are below a transistor region in a vertical dimension, as depicted in the figures and described herein. It is noted that as used herein, backside elements located below an active layer may be situated above, within, or below a silicon substrate on which the active layer is manufactured. That is, as used herein, "backside" is relative to the active layer, rather than the silicon substrate.

Figure 3:
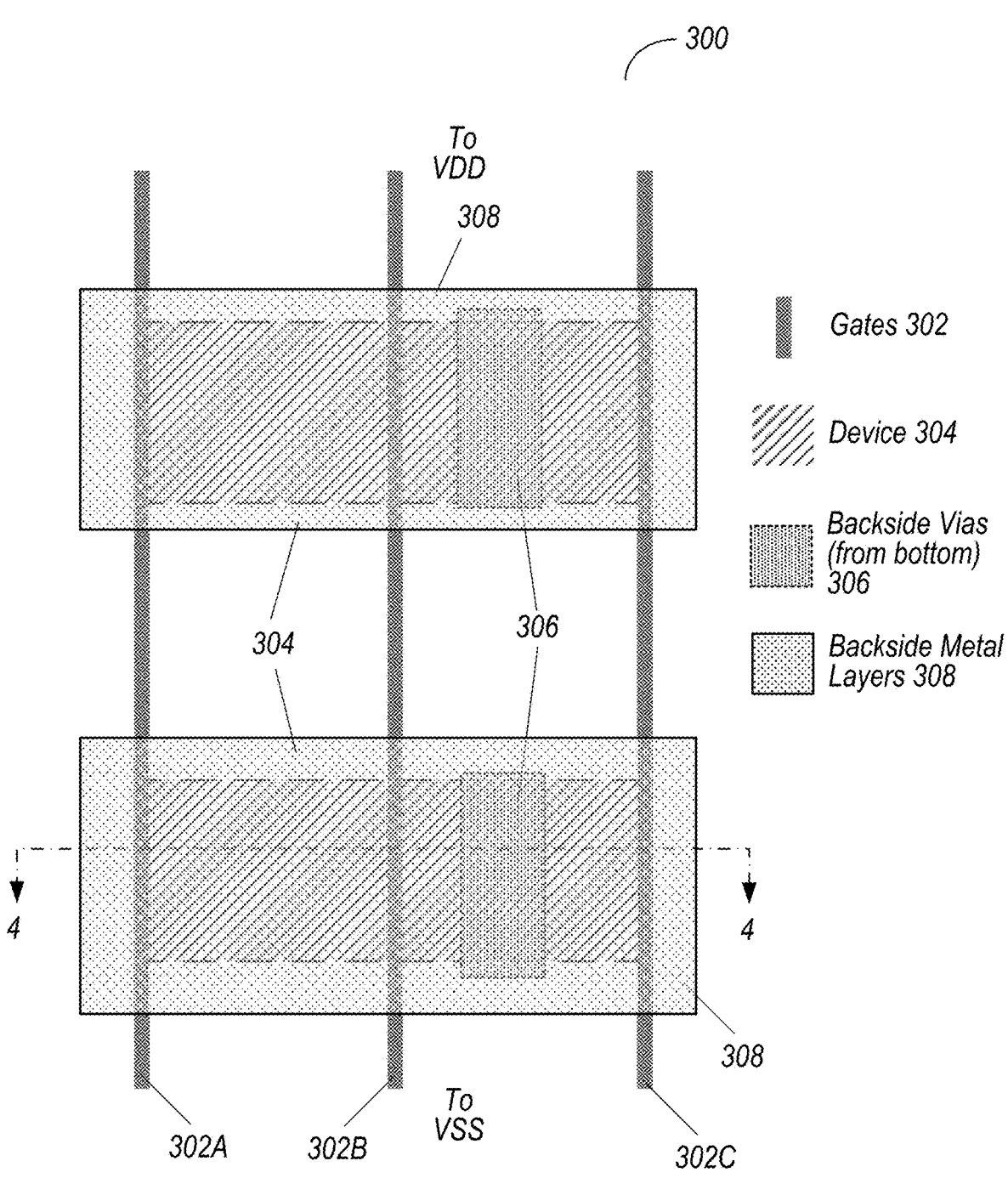
FIG. 3 depicts a bottom-view representation of an embodiment of a standard cell with backside power connections.

FIG. 3 depicts a bottom-view representation of an embodiment of standard cell 300 with backside layer power connections. In the illustrated embodiment of FIG. 3, standard cell 300 includes gates 302, device 304, backside vias 306, and backside metal layers 308. Gates 302 and device 304 may be substantially similar to gates 102 and device 104, depicted in FIG. 1. Vias 306 provide connections between device 304 (e.g., source/drain regions in the devices) and backside metal layers 308. Backside metal layers 308 may include one or more metal layers that provide power routing from device 304 to Vdd (e.g., the supply voltage) and Vss (e.g., ground).

Figure 4:
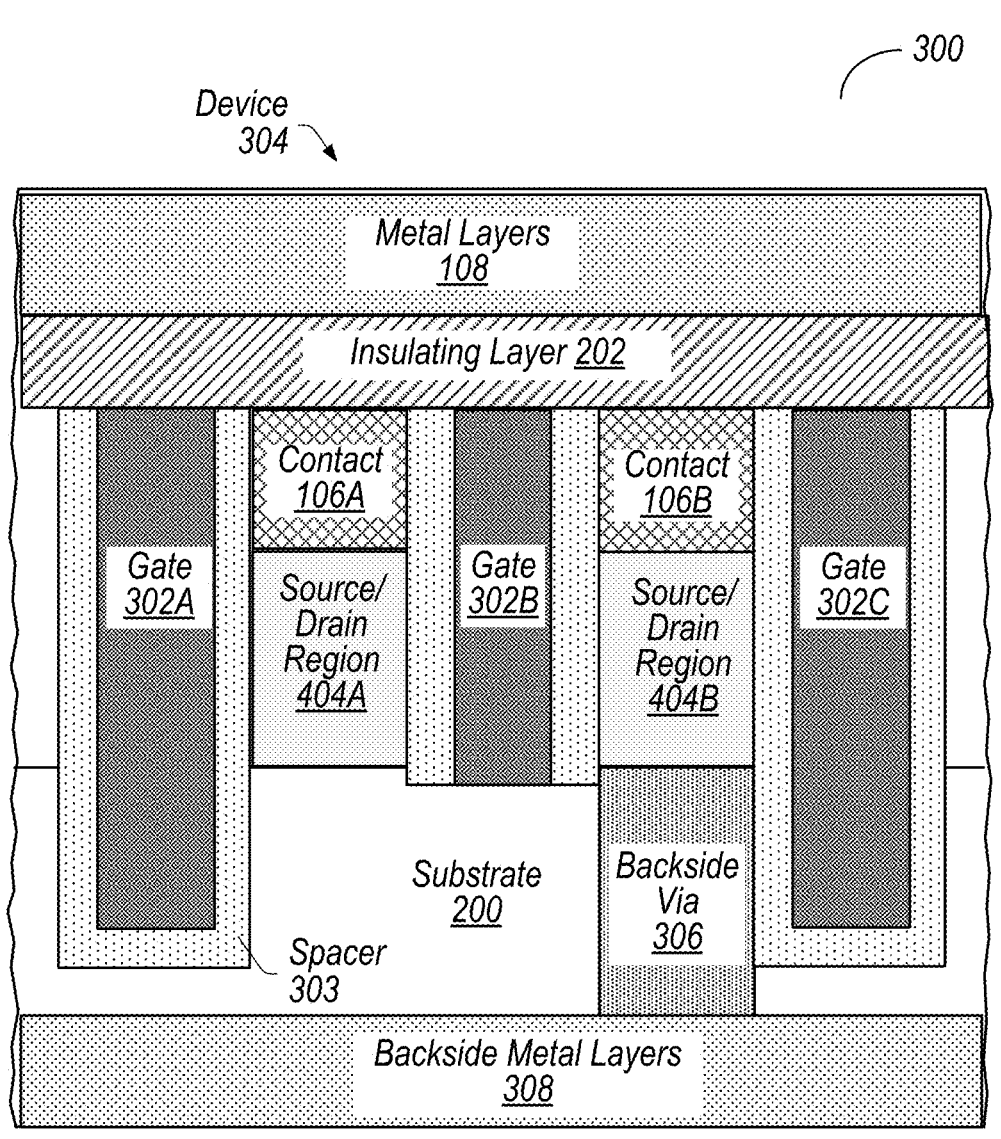
FIG. 4 depicts a cross-sectional representation of an embodiment of a standard cell along the sectional lines shown in FIG. 3.

FIG. 4 depicts a cross-sectional representation of the embodiment of standard cell 300 along the sectional lines shown in FIG. 3, according to some embodiments. In the illustrated embodiment, standard cell 300 includes substrate 200 with gates 302, gate spacers 303, and source/drain regions 404 formed in device 304. As shown in FIG. 4, source/drain regions 404 of device 304 are positioned above substrate 200 and below insulating layer 202 in the device. Source/drain regions 404 may be, for example, fins or nanosheet stacks in FinFETs, NSH, or GAAFET devices. Power connection to source/drain region 404B is made by backside via 306 from backside metal layers 308. Thus, in the illustrated embodiment of FIG. 4, backside via 306 routes power from source/drain region 404B to backside metal layers 308 and the backside metal layers replace power routing in metal layers 108 to provide power connections to device 304.

As shown in FIG. 4, backside via 306 and backside metal layers 308 are positioned below device 304 (e.g., in the backside layers of the device below source/drain regions 404). In certain embodiments, backside via 306 includes buried vias through substrate 200 to connect between source/drain regions 404 and backside metal layers 308. In some embodiments, as shown in the illustrated embodiment, backside metal layers 308 are formed at or near a bottom surface of substrate 200. In certain embodiments, backside metal layers 308 are one or more backside layers of an active layer of device 304 (e.g., backside metal layers 308 are vertically below the transistor region of device 304). In some embodiments, backside metal layers 308 are one or more buried layers in substrate 200 (e.g., the metal layers are buried or embedded underneath the bottom surface of the substrate). In some embodiments, backside metal layers 308 are buried beneath a carrier substrate layer (e.g., a silicon carrier substrate). Additional embodiments may be contemplated where backside metal layers 308 are not located in substrate 200.

As shown in FIGS. 3 and 4, moving the power connections to source/drain regions 404 below device 304 increases the available area above the device. It should be noted that contacts 106 and metal layers 108 are depicted above source/drain regions 404 in device 304 in FIG. 4 as the topside metal layers may be utilized for other connections within standard cell 300 (e.g., control signal connections). For instance, in some embodiments, power connections may be made to source/drain region 404B using backside via 306 and backside metal layers 308 while control signal connections are made to source/drain region 404A using contact 106A to metal layers 108. In some embodiments, the space for contacts 106 above source/drain regions 404B may be left empty to increase the available area above the source/drain regions and device 304. This empty area may be left empty or used for routing of other resources (such as additional contacts for control signals or contacts for other signals).

The embodiment of standard cell 300, depicted in FIGS. 3 and 4, may improve the utilization of area within the cell layout, as described above. Interface resistances within the cell (e.g., resistance at interfaces between source/drain regions 404 and backside via 306) may, however, present issues in the cell, especially as the size of the cell decreases. The present disclosure recognizes that redundant power connections can be made above and below the device to reduce the interface resistances in a standard cell layout.

Certain embodiments disclosed herein have three broad elements: 1) a transistor with a gate region, a source region, and a drain region where the transistor is located above a substrate in a vertical dimension perpendicular to substrate, 2) a first metal layer located above the transistor in the vertical dimension (e.g., on a topside of the transistor), and 3) a second metal layer located below the transistor in the vertical dimension (e.g., on a backside of the transistor). In some embodiments, one or more rails (such as power supply rails) are connected to both the first and second metal layers. For example, both a supply voltage rail and a ground rail may be connected to both the first and second metal layers (with the metal layers having separate routing for the supply voltage and ground). In certain embodiments, either the source region or the drain region of the transistor is connected to both the first and second metal layers. Connecting the source/drain region to both the first and second metal layers provides a redundant connection between the source/drain region and the supply voltage rail, the ground rail, or both rails.

In certain embodiments, the source regions are connected to the supply voltage rail and the drain regions are connected to the ground rail through both the first and second metal layers. For example, the source regions are connected to supply voltage routing in both the first and second metal layers where the routing in both metal layers connects to the supply voltage rail. Similarly, the drain regions are connected to ground routing in both the first and second metal layers where the routing in both metal layers connects to the ground rail.

In various embodiments, the rails connected to the first and second metal layers may be signal rails. For example, embodiments may be contemplated where the rail provides bit cell signals. Providing redundant signal connections between the source/drain regions to the signal rails may allow the signals to escape the device with less resistance than a single connection. In some embodiments, source or drain regions from adjacent devices (e.g., adjacent transistors) may be selectively connected to the first metal layer or the second metal layer. For example, via programming may be implemented in a multi-transistor layout to alternate connections from the source/drain regions between the first metal layer and the second metal layer in alternating transistors.

In short, the present inventors have recognized that providing connections for devices both above the devices and below the devices in a cell layout improves the performance of the cell. Providing redundant connections above and below the devices reduces the interface resistances within the cell. For example, interface resistances between diffusion regions and metal in the cell are reduced using the redundant connections, thereby improving performance of the cell. The present inventors have also recognized that while providing redundant connections above and below the devices does have an area cost because of the connections above the devices, the reduction in interface resistances in the cell still improves performance of the cell versus cells only having connections below the devices (such as shown in FIGS. 3 and 4). Additionally, redundant connections may reduce interface resistances in the cell and improve performance of the cell without having to increase the size of the cell or without having to provide extra power to the cell.

Figure 5:
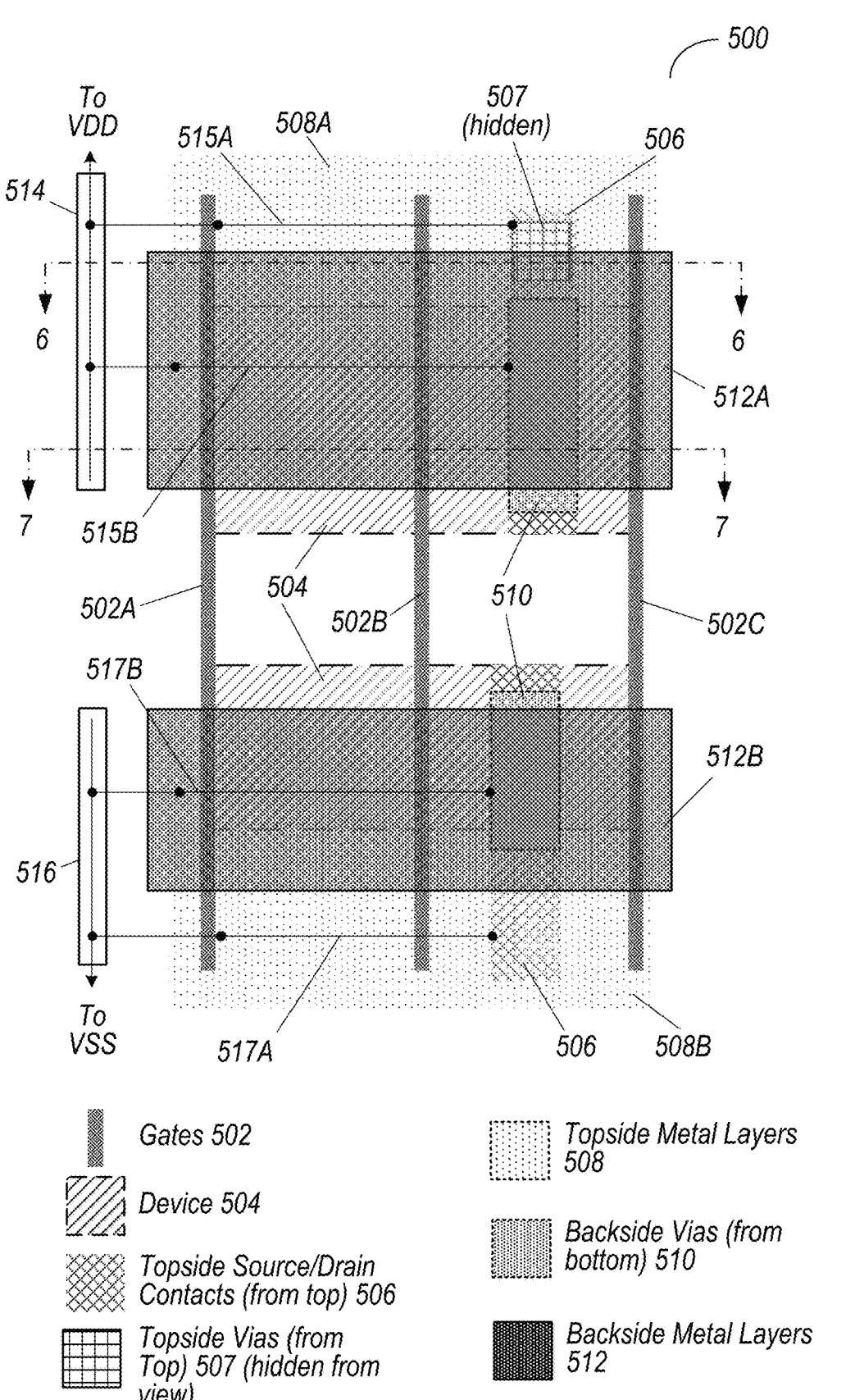
FIG. 5 depicts a bottom-view representation of an embodiment of a standard cell that has both topside connections and backside connections.

FIG. 5 depicts a bottom-view representation of an embodiment of standard cell 500 that has both topside and backside power connections. In the illustrated embodiment, standard cell 500 includes gates 502 and device 504. Gates 502 and device 504 may be similar to other embodiments described herein. In certain embodiments, gates 502 are poly lines formed from polysilicon layers or metal layers and device 504 is a transistor (e.g., a FinFET device or a nanosheet FET device). Standard cell 500 includes both topside (source/drain) contacts 506 and topside vias 507 to topside metal layers 508 and backside vias 510 to backside metal layers 512. It should be noted that while topside vias 507 are illustrated in FIG. 5, the topside vias are typically hidden in the bottom-view by topside contacts 506. In some embodiments, topside contacts 506 provide control signal connections between device 504 and topside metal layers 508 while topside vias 507 and backside vias 510 provide power connections from the device to topside metal layers 508 and backside metal layers 512, respectively.

Figure 6:
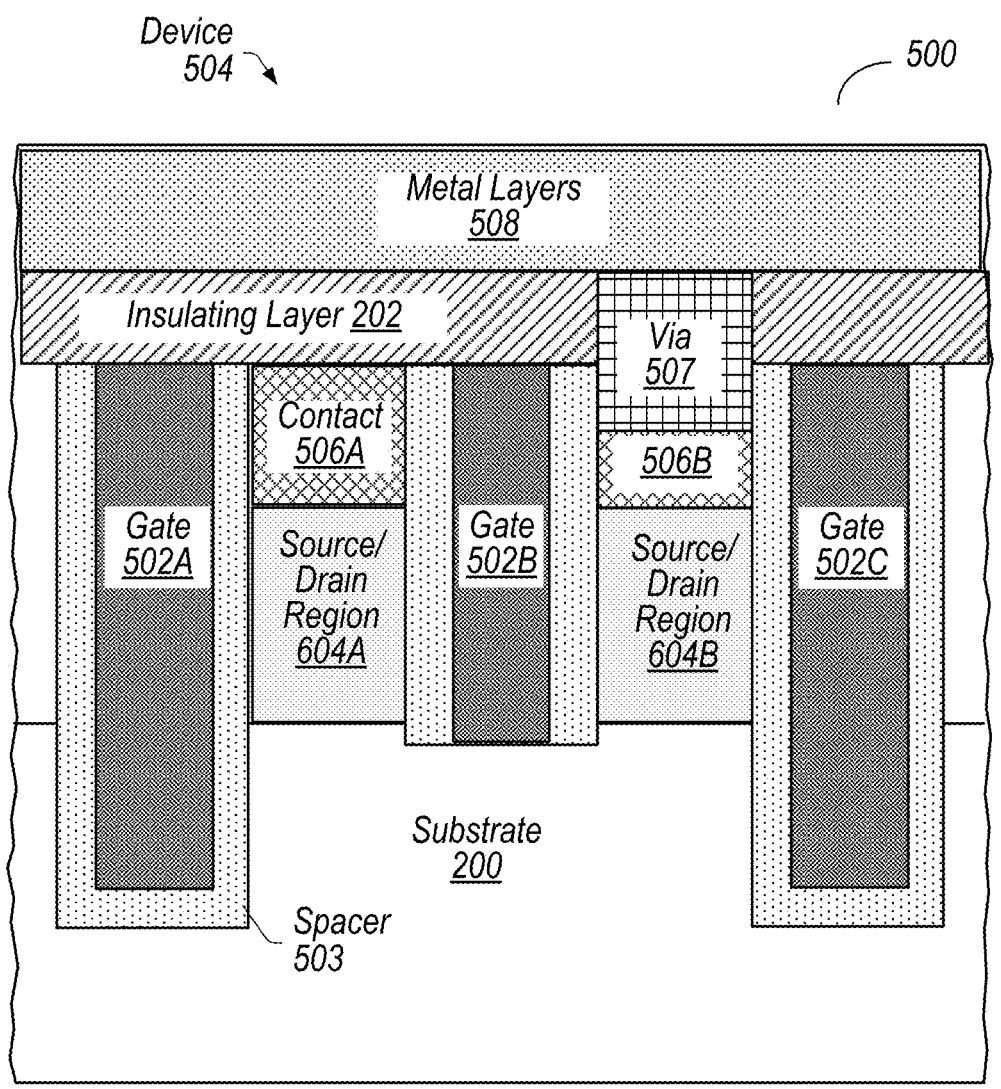
FIG. 6 depicts a cross-sectional representation of an embodiment of a standard cell along the sectional lines 6-6 shown in FIG. 5.

In certain embodiments, power routing in topside metal layers 508 and power routing in backside metal layers 512 are coupled to rail 514 and rail 516. In the illustrated embodiment, rail 514 is a supply voltage rail and rail 516 is a ground rail for a power supply coupled to the rails. Other embodiments may also be contemplated where rail 514 and rail 516 are coupled to different power supplies or carry different potentials. In various embodiments, topside metal layers portion 508A and backside metal layers portion 512A provide routing from device 504 to Vdd (e.g., the supply voltage) (shown representatively by the line for power routing 515A in topside metal layer 508A and the line for power routing 515B in backside metal layer 512A). Similarly, topside metal layers portion 508B and backside metal layers portion 512B provide routing from device 504 to Vss (e.g., the ground voltage) (shown representatively by the line for ground routing 517A in topside metal layer 508B and the line for ground routing 517B in backside metal layer 512B). It should be noted that rail 514 and rail 516 and the couplings to/from the rails are shown schematically in the illustrated embodiment and that actual implementations of the rails and the coupling to/from the rails may be undertaken through various designs based on the desired functions for standard cell 500. Additionally, while topside vias 507 and backside vias 510 are shown not overlapping vertically in FIG. 5, various embodiments may be contemplated where there is partial or complete overlap between the topside and backside vias in the vertical direction As shown in FIG. 5, device 504 is connected to rail 514 and rail 516 using both topside metal layers 508 and backside metal layers 512. FIG. 6 depicts a cross-sectional representation of the embodiment of standard cell 500 along the sectional lines 6-6 shown in FIG. 5. In the illustrated embodiment, standard cell 500 includes substrate 200 with gates 502, gate spacers 503, and source/drain regions 604 formed above the substrate. Source/drain regions 604 are source/drain regions of device 504. Source/drain regions 604 may be, for example, fins or nanosheet stacks in FinFETs or NSH devices. In certain embodiments, topside contact 506A couples to source/drain region 604A while topside contact 506B and topside via 507 couple source/drain region 604B to topside metal layers 508. In some embodiments, as described herein, topside contact 506B and topside via 507 connect source/drain region 604B to power routing in topside metal layers 508 (e.g., routing to rail 514 or rail 516) while topside contact 506A provides signal routing to source/drain region 604A (e.g., through connected control signal routing in topside metal layers 508). For instance, in the illustrated embodiment of FIGS. 5 and 6, topside contact 506B and topside via 507 connect source/drain region 604B to topside metal layers portion 508A for routing to rail 514 and Vdd. As shown in FIG. 6, there is no connection (e.g., via or contact) between source/drain regions 604 and no backside metal layers 512 along the path of sectional lines 6-6 in FIG. 5.

Figure 7:
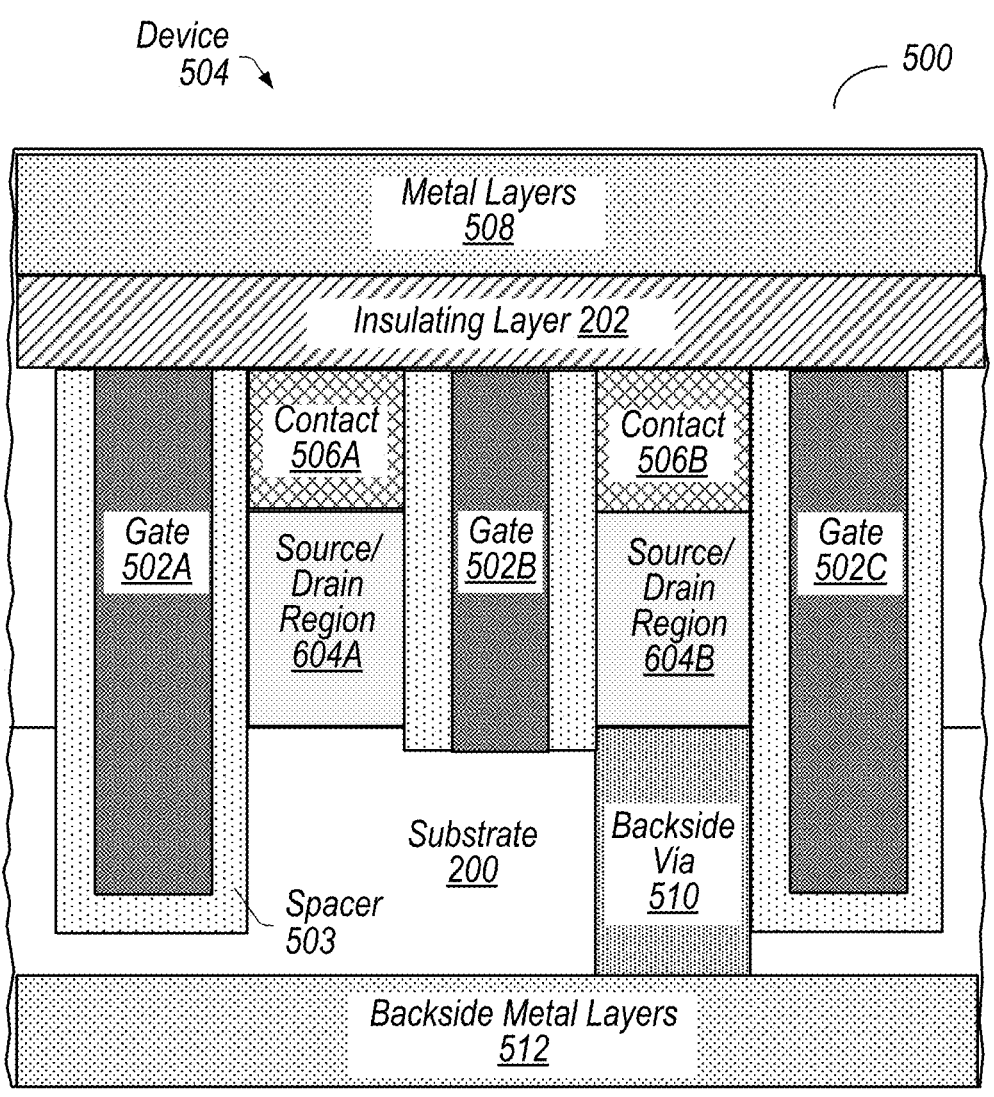
FIG. 7 depicts a cross-sectional representation of an embodiment of a standard cell along the sectional lines 7-7 shown in FIG. 5.

FIG. 7 depicts a cross-sectional representation of the embodiment of standard cell 500 along the sectional lines 7-7 shown in FIG. 5. In the illustrated embodiment, backside via 510 and backside metal layers 512 are positioned below source/drain regions 604 of device 504 (e.g., in the backside layers of the device). In certain embodiments, backside via 510 is a buried via through substrate 200 to connect source/drain region 604B to backside metal layers 512. In various embodiments, as shown in FIG. 7 and described herein, backside metal layers 512 are formed at or near a bottom surface of substrate 200. In some embodiments, backside metal layers 512 are buried layers in substrate 200 (e.g., the metal layers are buried or embedded underneath the bottom surface of the substrate). Additional embodiments may be contemplated where backside metal layers 512 are not located in substrate 200.

In certain embodiments, backside via 510 connects source/drain region 604B to power routing in backside metal layers 512 (e.g., routing to rail 514 or rail 516). For instance, in the illustrated embodiment of FIGS. 5 and 7, backside via 510 connects source/drain region 604B to backside metal layers portion 512A for routing to rail 514 and Vdd. As shown in FIG. 7, there is no vertical connection (e.g., via) between source/drain regions 604A, 604B and topside metal layers 508 along the path of sectional lines 7-7 in FIG. 5.

In various embodiments, as shown in FIGS. 5-7, standard cell 500 includes power connections between device 504 and rails 514 and 516 using connections both above and below the device in the standard cell (e.g., in both the topside layers and the backside layers of the device). For instance, rail 514 is connected to source/drain region 604B through both topside via 507 and topside metal layers portion 508A and backside via 510 and backside metal layers portion 512A. Providing power connections both above and below device 504 may reduce the interface resistance between diffusion regions (e.g., source/drain regions 604B) and metal layers (e.g., topside vias 507 and backside vias 510), in standard cell 500. For instance, the interface resistance is reduced by increasing the area of connection between the diffusion regions and the metal layers using connections to rails 514 and 516 from both above and below device 504 and reducing the resistance in the path between the rails and the device. In some embodiments, the interface resistance in standard cell 500 is reduced to about half the interface resistance in either standard cell 100 or standard cell 300 as standard cell 500 doubles the number of power connections to rails 514 and 516.

Providing the redundant power connections above and below device 504 in standard cell 500 may have an increased area cost compared to standard cell 300 because of the connections above the devices. The reduction in interface resistance in standard cell 500, however, improves performance of standard cell 500 compared to standard cell 300. For example, standard cell 500 may have an approximately 5% or greater improvement in performance versus standard cell 300. Additionally, standard cell 500 has even greater performance versus standard cell 100 while having the same area cost. Thus, standard cell 500 may have improved performance without having to increase the size of the cell or without having to provide extra power to the cell.

In some embodiments, the characteristics of the metal in topside vias 507 and topside metal layers 508 versus the metal in backside vias 510 and backside metal layers 512 are used in controlling properties of a power supply providing power to device 504. For example, the resistances of the metal in topside vias 507 and topside metal layers 508 may be characterized versus the resistances of the metal in backside vias 510 and backside metal layers 512 to determine the relative percentages of power to be provided through the topside metal layers and the backside metal layers. The power supply providing power to standard cell 500 may then be controlled using programming or modelling based on the relative percentages. In some embodiments, one or more tie cells may be coupled to the topside and backside metal layers to tie the topside and backside metal layers together.

In some embodiments, the power supply may be connected to the topside and backside metal layers without any programming or modelling such that the power supply distributes power to the topside and backside metal layers based on their relative resistances. In such embodiments, the mismatch between the resistances in the topside metal layers and the resistances in the backside metal layers may be small. The small differences may be within tolerable limits such that no programming or modelling of the power supply is needed. For example, the difference in voltage on the topside metal layers and the backside metal layers may be on the order of a few millivolts.

Figure 8:
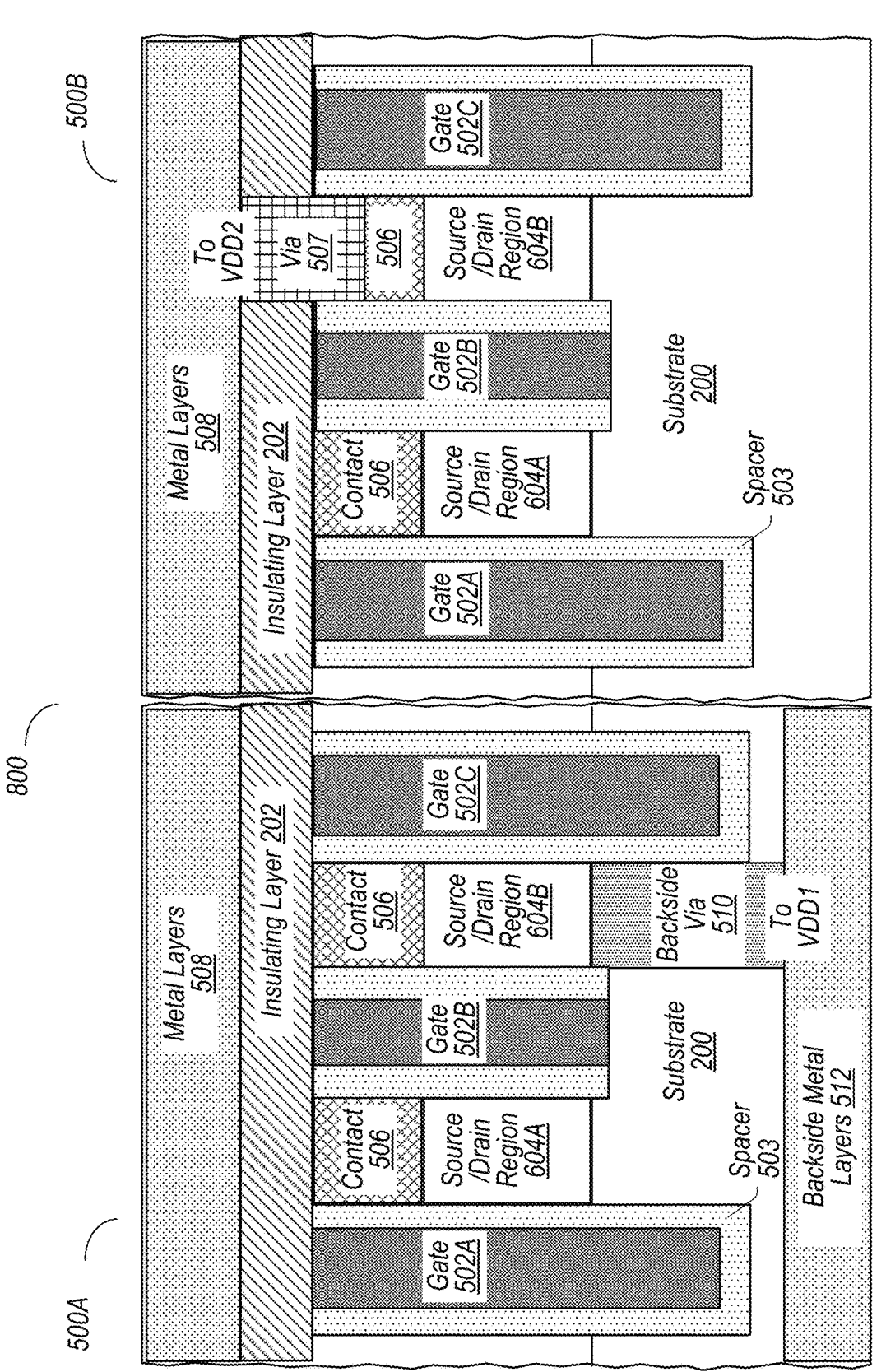
FIG. 8 depicts a cross-sectional representation of an embodiment of a system with two standard cells having via programming.

In some embodiments, standard cell 500 may be implemented in a plurality of standard cells with via programming between the cells. FIG. 8 depicts a cross-sectional representation of an embodiment of a system with two standard cells 500 having via programming. System 800 includes first standard cell 500A and second standard cell 500B. While two standard cells are depicted, it should be understood that system 800 may include a plurality of alternating standard cells similar to first standard cell 500A and second standard cell 500B.

System 800 may include routing between two voltage sources, Vdd1 and Vdd2, to first standard cell 500A and second standard cell 500B. In the illustrated embodiment, Vdd1 is routed to backside metal layers 512 in first standard cell 500A and Vdd2 is routed to topside metal layers 508 in second standard cell 500B. Via programming is implemented in system 800 to alternate connections to Vdd1 and Vdd2 in first standard cell 500A and second standard cell 500B.

For example, as shown in FIG. 8, in first standard cell 500A, there is no connection (no contact via) between topside metal layers 508 (routed to Vdd2) and source/drain regions 604A, 604B while there is connection between backside metal layers 512 (routed to Vdd1) and source/drain region 604B using backside via 510. Conversely, in second standard cell 500B, there is connection between topside metal layers 508 (routed to Vdd2) and source/drain region 604B with via 507 while there is no connection between backside metal layers 512 (routed to Vdd1) and source/drain region 604A, 604B. Thus, first standard cell 500A receives Vdd1 while second standard cell 500B receives Vdd2 based on the programming determined by the presence/absence of contact vias in the standard cells.

The embodiments shown in FIGS. 5-8 provide reduced interface resistances for power connections by having connections both above and below device 504. Various embodiments may also be contemplated to provide signal (e.g., control signal) connections for gates both above and below a transistor device (such as device 504) to potentially provide additional benefits for signal transmission in a cell (such as standard cell 500). For instance, providing additional signal connections or routing through the cell may reduce RC delay, which typically comes from resistances at via connections in the topside layers of the cell.

Providing signal connections to gates in backside metal layers (e.g., backside vias 510 connections to backside metal layers 512) may, however, be unreliable and difficult or costly to implement. For example, placing signal connections to gates in the backside layers may place signal and supply connections in close proximity, thereby causing parasitic issues that reduce reliability of the device. Additionally, forming signal connections to gates in the backside layers may require a highly controlled process to be able to place the signal connections and power connections in close proximity, thereby increasing costs and lowering device yields. The present disclosure contemplates providing routing paths for signal connections in the backside layers to reduce resistances in transmitting signals without the need for backside layer connections to gates in proximity of power connections. The disclosed approaches may improve performance of an integrated circuit cell over previous cell layouts, such as those depicted in FIGS. 1-4, by reducing RC delay in the cell.

Certain embodiments disclosed herein have three broad elements: 1) a first transistor and a second transistor located in a transistor region of an integrated circuit, 2) a via structure on a side of the first transistor opposite to the second transistor, and 3) a control signal routed from the second transistor to the first transistor that goes from the second transistor into a backside metal layer, through the via structure to a topside metal layer, and through the topside metal layer to a gate of the first transistor. In certain embodiments, the control signal route passes below the first transistor in the backside metal layer. In some embodiments, the control signal route goes between a signal output of the second transistor and a signal input of the first transistor.

In various embodiments, the via structure includes an inactive (e.g., "dummy") source/drain region and one or more vias that connect the backside metal layer to the topside metal layer. In some embodiments, two or more via structures are implemented to transmit the control signal between the backside metal layer and the topside metal layer. The two or more via structures may transmit the control signal in parallel between the backside metal layer and the topside metal layer. The via structures may then be connected together (e.g., "shorted") in the metal layers to transmit the control signal.

In short, the present inventors have recognized that providing routing connections for a control signal through a backside layer without additional gate connections in the backside layer is possible by using via structures on an opposite side of a transistor from the connecting transistor. The via structures may be, for example, inactive (e.g., "dummy") transistors. Providing the routing connections under the transistor, through the backside layer, through the via structures provides a control signal route, in addition to other routes, to reduce the RC delay in signal transmission. While the addition of such via structures may have an area cost, the improvement in performance of a cell with the control signal routed through the via structures may provide a substantial return in signal transmission that is worth the area cost.

Figure 9:
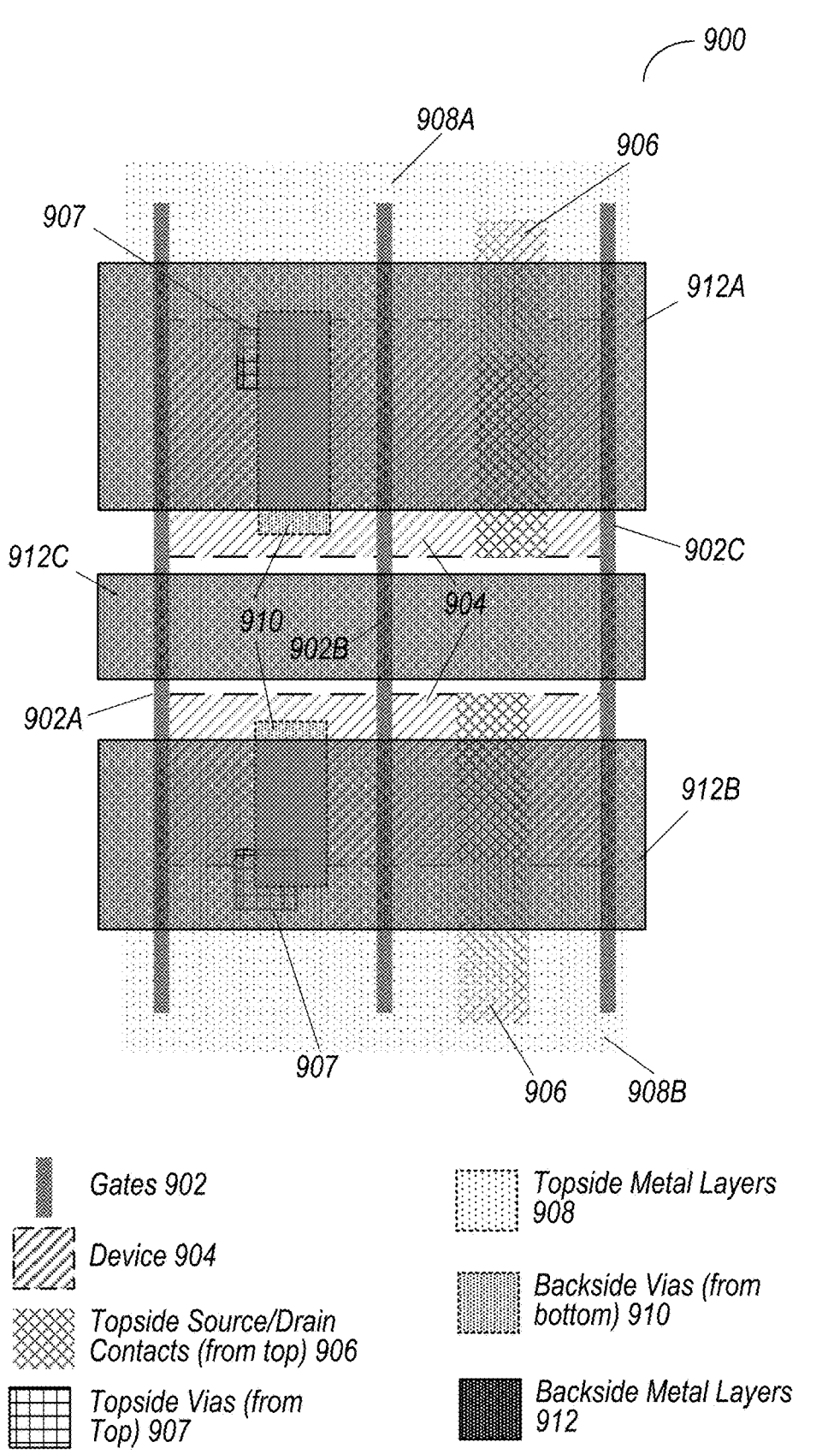
FIG. 9 depicts a bottom-view representation of an embodiment of a cell with both topside and backside power connections along with a backside signal routing connection.

FIG. 9 depicts a bottom-view representation of an embodiment of cell 900 with both topside and backside power connections along with a backside signal routing connection. Cell 900 may be, for example, a standard cell or a custom circuit design cell. In the illustrated embodiment, cell 900 includes gates 902 and device 904. Gates 902 and device 904 may be similar to other embodiments of gates and devices described herein. In certain embodiments, gates 902 are poly lines formed from polysilicon layers or metal layers and device 904 is a transistor (e.g., a FinFET device, a nanosheet FET device, or a GAAFET device). Device 904 also includes both topside (source/drain) power contacts 906 and topside vias 907 to topside metal layers 908 and backside vias 910 to backside metal layers 912. Topside vias 907 provide power connections (e.g., Vdd/Vss connections) between device 904 and topside metal layers 908 while backside vias 910 provide power connections between the device and backside metal layers 912.

As described herein, topside metal layers 908 and backside metal layers 912 may be coupled to power rails to provide power connections to device 904. For instance, topside metal layers portion 908A and backside metal layers portion 912A may provide routing from device 904 to Vdd (e.g., the supply voltage) while topside metal layers portion 908B and backside metal layers portion 912B provides routing from device 904 to Vss (e.g., the ground voltage). For simplicity in the drawing, power rails are not shown in the embodiment of cell 900 in FIG. 9.

In certain embodiments, backside metal layers 912 includes backside metal layers portion 912C. Backside metal layers portion 912C, as described herein, may be implemented to provide routing connection for control signals through cell 900. Backside metal layers portion 912C may be in the same backside metal layers as backside metal layers portion 912A and backside metal layers portion 912B or may be in a different backside metal layers. In various embodiments, backside metal layers portion 912C includes the first or second backside metal layers.

As shown in FIG. 9, backside vias 910 do not contact backside metal layers portion 912C to avoid shorting between the power connections and signal connections routed through backside metal layers 912. As described above, placing gate connections in backside metal layers 912 may be difficult, unreliable, and costly in view of the power connections in the backside metal layers (e.g., backside vias 910 and backside metal layers portions 912A and 912B). Accordingly, the present disclosure contemplates providing routing connections through backside metal layers portion 912C without providing connections through backside vias 910 under (e.g., in the vertical region of) device 904. In various embodiments, as shown in FIGS. 10-13, a "dummy" cell may be positioned adjacent to cell 900 to provide routing for control signals.

Figure 10:
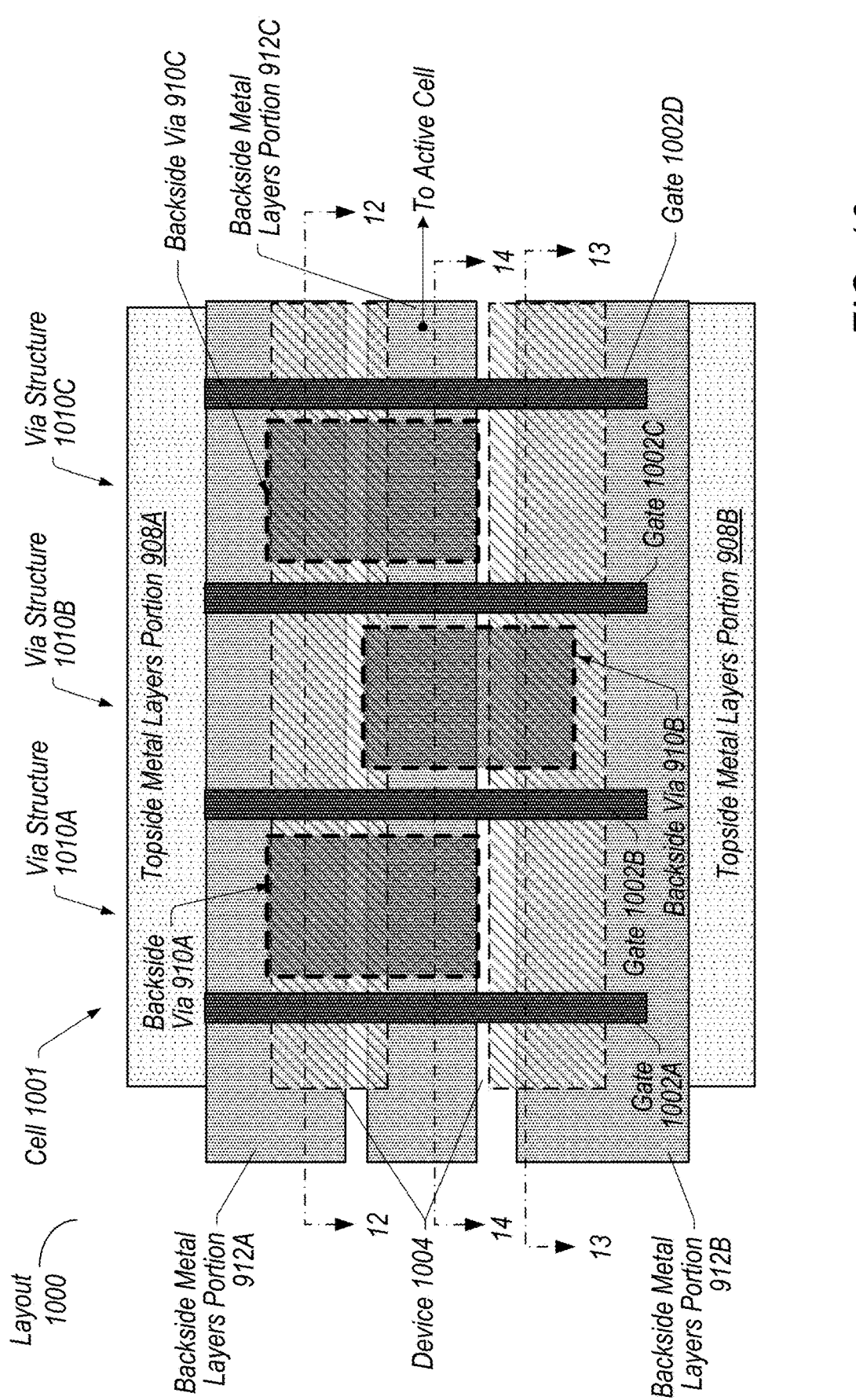
FIG. 10 depicts a bottom-view representation of a layout, according to some embodiments.

FIG. 10 depicts a bottom-view representation of layout 1000, according to some embodiments. In the illustrated embodiment, layout 1000 includes cell 1001. Cell 1001 includes inactive ("dummy") gates 1002A, 1002B, 1002C, 1002D with via structures 1010A, 1010B, 1010C positioned between the inactive gates to form inactive ("dummy") device 1004. In various embodiments, cell 1001 may be positioned adjacent an active cell and gate (e.g., cell 900 and gate 902A, shown in FIG. 9). In certain embodiments, cell 1001 is a unique cell included adjacent an end portion of the active cell (e.g., in an end portion of the cell layout) or another signal end point in the cell layout. Cell 1001 includes paths for extensions of the three backside metal layers portions 912A, 912B, 912C. In certain embodiments, the extension for backside metal layers portion 912C provides a routing path for control signals associated with the active cell (e.g., device 904). It should be understood that each of metal layer portions 912A, 912B, 912C may be located in a single backside metal layer, different backside metal layers, or combinations of backside metal layers.

In certain embodiments, cell 1001 includes one or more via structures 1010. In the illustrated embodiment, cell 1001 includes three via structures 1010A, 1010B, 1010C though any number of via structures 1010 may be contemplated. As described herein, via structures 1010 may include backside vias 910, topside vias 907 (shown in FIG. 11), and inactive (e.g., "dummy"), and source/drain regions 1214 (shown in FIGS. 12 and 13) connecting backside metal layers portion 912C to topside metal layers 908. Backside vias 910A, 910B, 910C provide connection between the source/drain regions of device 1004 (e.g., source/drain regions 1214, shown in FIGS. 12 and 13) and backside metal layers portion 912C.

Figure 11:
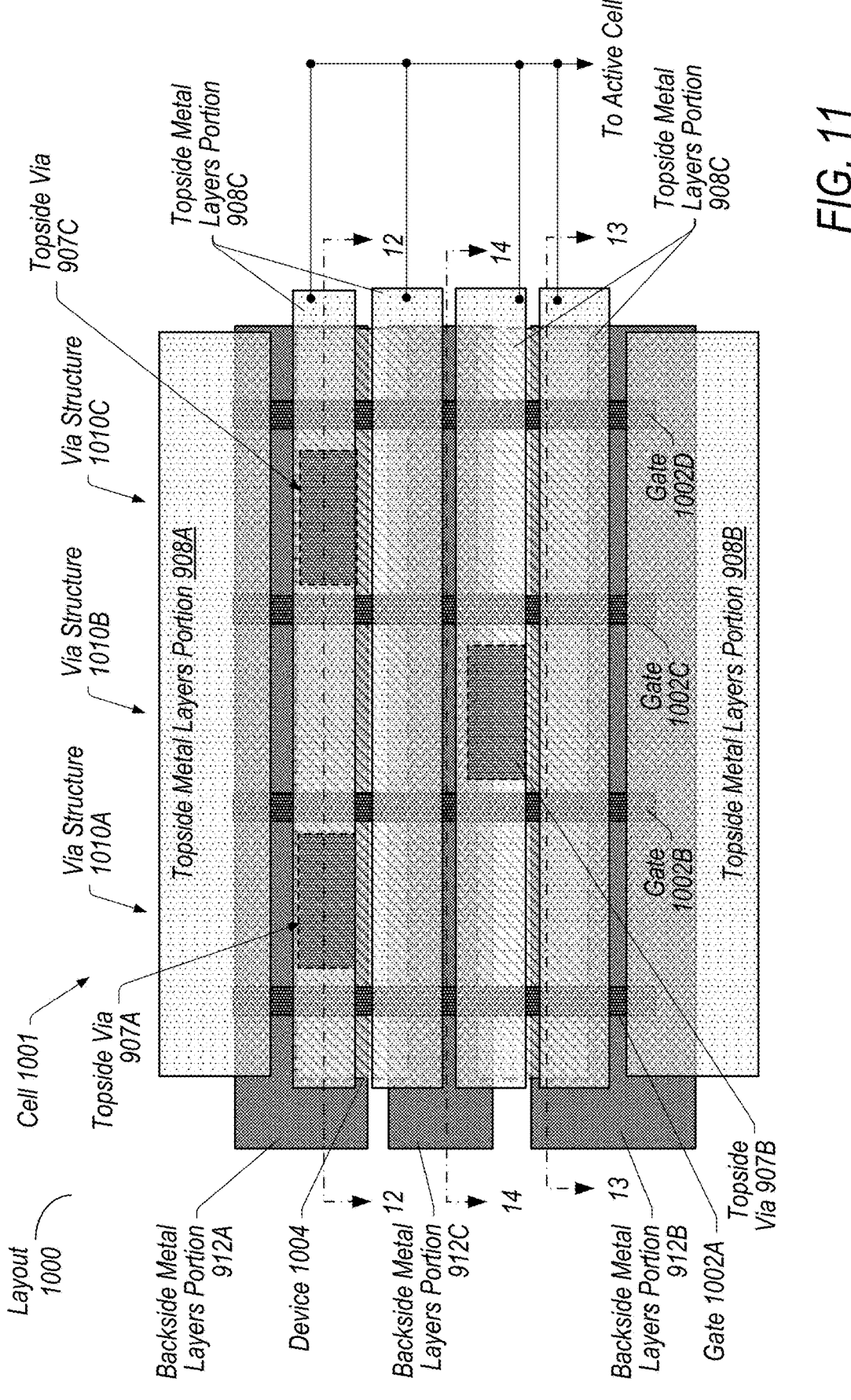
FIG. 11 depicts a top-view representation of a layout, according to some embodiments.

FIG. 11 depicts a top-view representation of layout 1000, according to some embodiments. In the illustrated embodiment, via structures 1010 include topside vias 907A, 907B, 907C that connect the source/drain regions of device 1004 (e.g., source/drain regions 1214, shown in FIGS. 12 and 13) to topside metal layers portion 908C. In some embodiments, topside metal layers portion 908C includes multiple portions (e.g., paths). These multiple paths may be connected (e.g., shorted) together, as shown schematically in FIG. 11, to provide a connection between topside vias 907 and the active cell. For instance, a gate via may connect topside metal layers portion 908C down to gates in the active cell (such as gates 902, in FIG. 9). In some embodiments, topside metal layers portion 908C is located in a first metal layer in topside metal layers 908 though other metal layers may be implemented.

In the illustrated embodiment of FIGS. 10 and 11, topside metal layer portions 908A, 908B and backside metal layers portions 912A, 912B are not connected to any portions of device 1004 in cell 1001. For instance, there are not any topside vias 907 or backside vias 910 that connect the source/drain regions in device 1004 (e.g., source/drain regions 1214, shown in FIGS. 12 and 13) to topside metal layer portions 908A, 908B or backside metal layers portions 912A, 912B. Without these connections, there are no power connections provided in device 1004 and device 1004 is an inactive (e.g., "dummy") device. With device 1004 being inactive, a control signal route through (e.g., control signal route 1220, shown in FIGS. 12 and 13) can pass through device 1004 without any interference from power signals.

Figure 12:
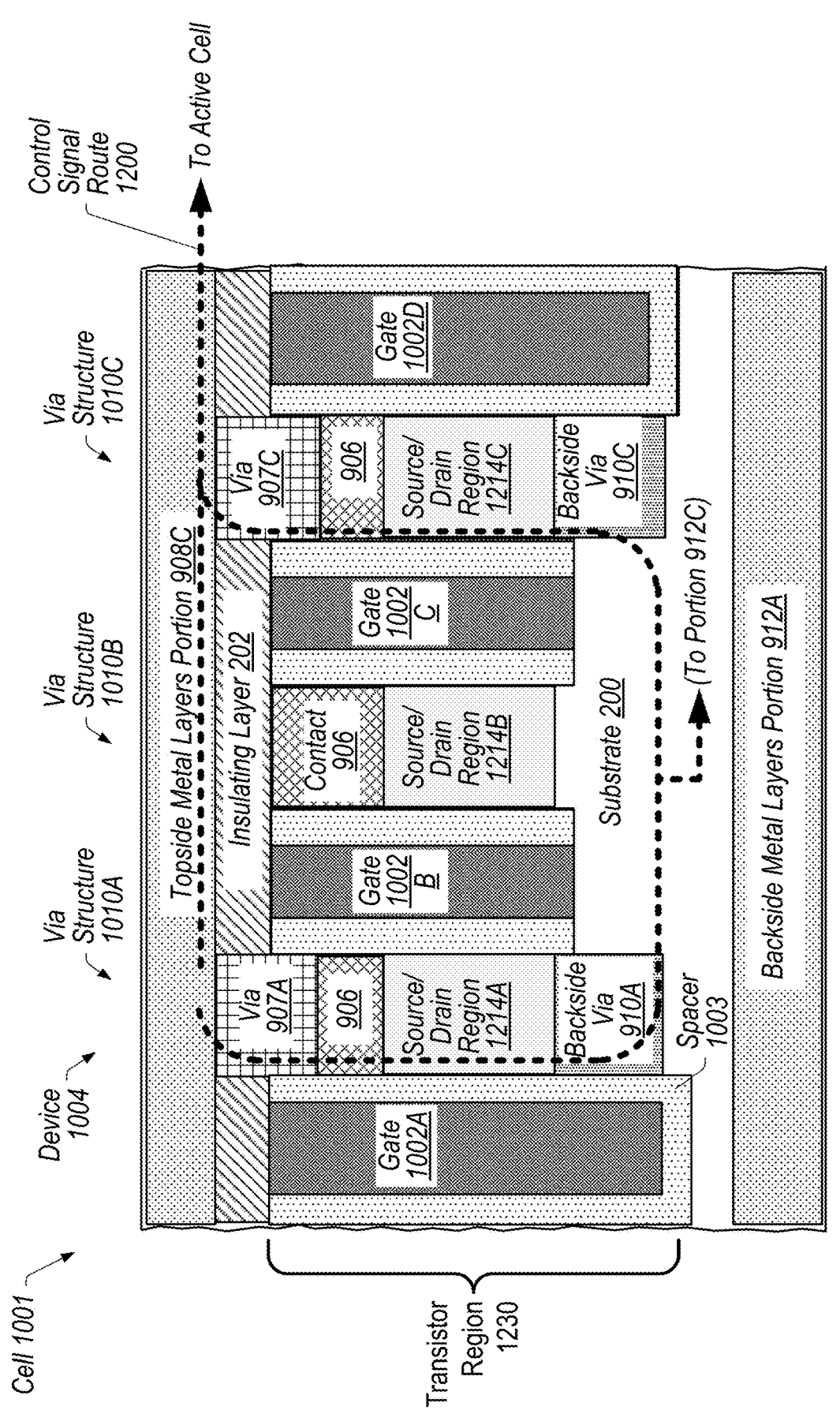
FIG. 12 depicts a cross-sectional representation of an embodiment of the layout along section lines 12-12 in FIGS. 10 and 11, according to some embodiments.

FIG. 12 depicts a cross-sectional representation of an embodiment of layout 1000 along section lines 12-12 in FIGS. 10 and 11, according to some embodiments. In the illustrated embodiment, a path for control signal route 1200 (dotted line) is depicted between source/drain regions 1214A, 1214C and the active cell. Control signal route 1200, for instance, goes from source/drain regions 1214A and 1214C, through contacts 906 and topside vias 907A and 907C, to topside metal layers portion 908C, which then routes to the active cell. In the cross-section of cell 1001 shown in FIG. 12, via structures 1010A and 1010C provide path for control signal route 1200 to topside metal layers portion 908C above backside metal layers portion 912A (which includes power routing). Backside vias 910A, 910C are also positioned along the cross-section depicted in FIG. 12. It should be noted, however, that backside vias 910A, 910C in via structures 1010A, 1010C, respectively, (as also shown in FIG. 10) provide a connection path to backside metal layers portion 912C, not to backside metal layers portion 912A. Accordingly, in the illustrated embodiment of FIG. 12, control signal route 1200 has a path from source/drain regions 1214A, 1214C into backside vias 910A, 910C, and then to backside metal layers portion 912C (which then routes to the active cell) while backside vias 910A, 910C are not connected to backside metal layers portion 912A. Thus, as shown in FIG. 12, control signal route 1200 has a path between topside layer metal layers portion 908C and backside metal layers portion 912C through both source/drain region 1214A and source/drain region 1214C.

Various embodiments of metal routing between backside vias 910A, 910C and backside metal layers portion 912C may be contemplated. Metal routing may include, for example, any combination of metal vias, metal wires, metal traces, etc. that provide a path/route between the two structures. For instance, in one embodiment, backside vias 910A, 910C may vertically extend downwards from source/drain regions 1214A, 1214C, respectively, (as shown in FIG. 12)

into substrate 200 where additional metal routing then connects the backside vias to backside metal layers portion 912C.

Figure 13:
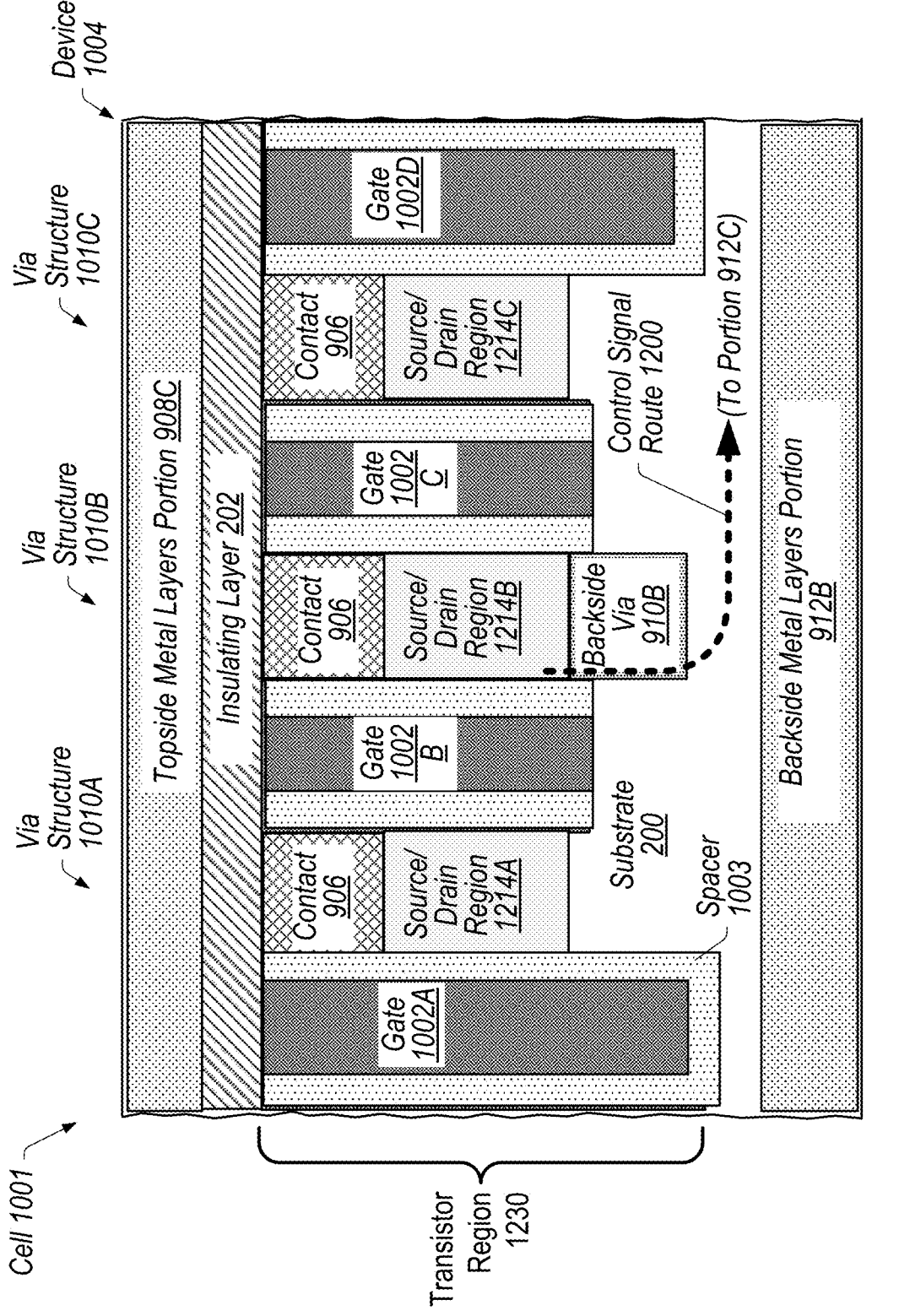
FIG. 13 depicts a cross-sectional representation of an embodiment of the layout along section lines 13-13 in FIGS. 10 and 11, according to some embodiments.

FIG. 13 depicts a cross-sectional representation of an embodiment of layout 1000 along section lines 13-13 in FIGS. 10 and 11, according to some embodiments. In the cross-section of cell 1001 shown in FIG. 13, via structure 1010B provides path for control signal route 1200 between source/drain region 1214B and backside metal layers portion 912C. Similar to the cross-section of FIG. 12, in the cross-section of FIG. 13, backside metal layers portion 912B (e.g., power routing) is positioned below transistor region 1230. Backside via 910B in via structure 1010B (also shown in FIG. 10), however, provides a connection path to backside metal layers portion 912C, not to backside metal layers portion 912B, for source/drain region 1214B. Accordingly, control signal route 1200 goes from source/drain region 1214B, through backside via 910B, and then to backside metal layers portion 912C (which then routes to the active cell). As described above, various embodiments of metal routing between the bottom of backside via 910B and backside metal layers portion 912C may be contemplated. For instance, in one embodiment, backside via 910B vertically extends into substrate 200 where additional metal routing connects the backside via to backside metal layers portion 912C.

Figure 14:
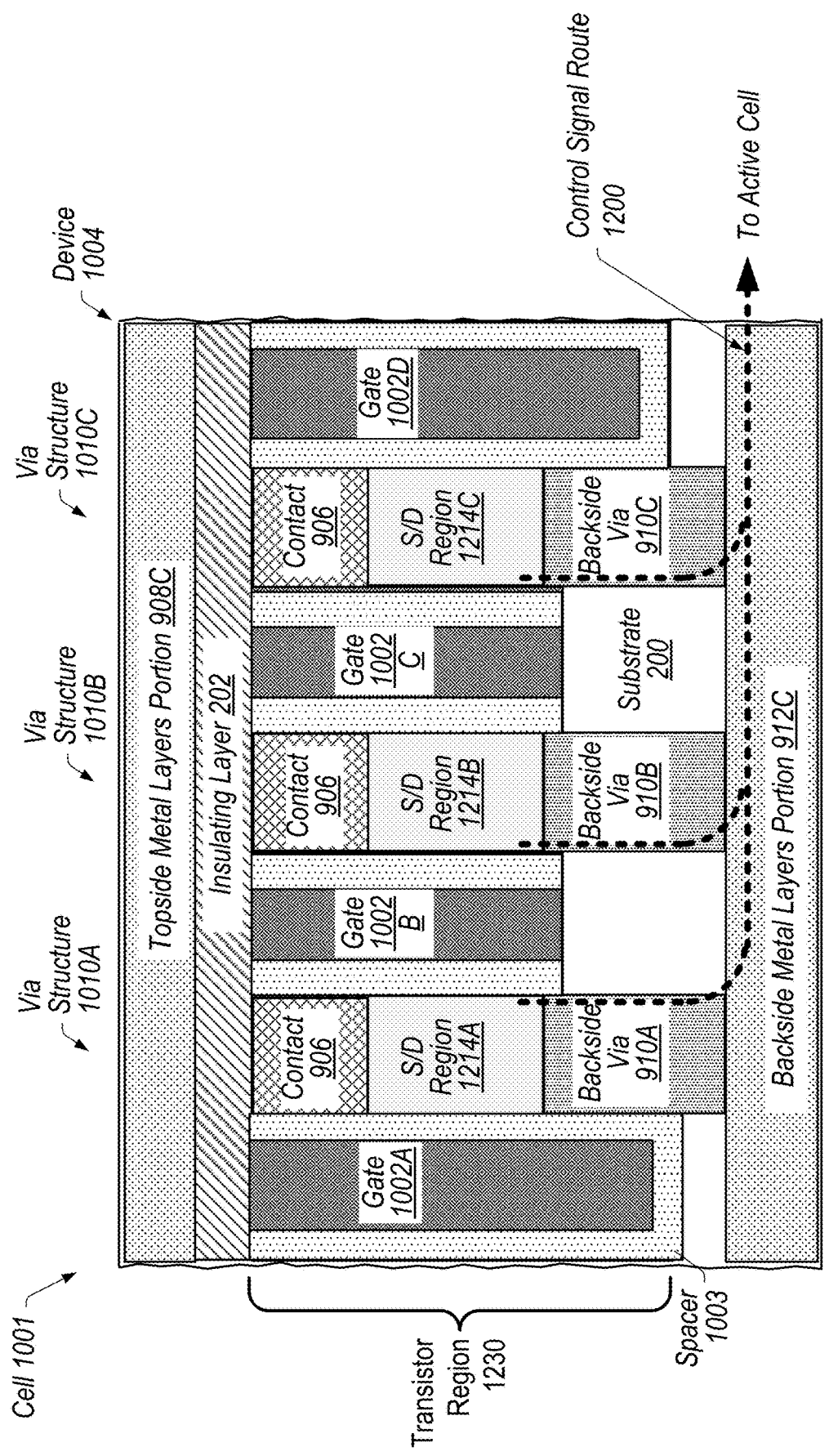
FIG. 14 depicts a cross-sectional representation of an embodiment of the layout along section lines 14-14 in FIGS. 10 and 11, according to some embodiments.

FIG. 14 depicts a cross-sectional representation of an embodiment of layout 1000 along section lines 14-14 in FIGS. 10 and 11, according to some embodiments. In the cross-section of cell 1001 shown in FIG. 14, via structures 1010A, 1010B, and 1010C provide a path for control signal route 1200 between source/drain regions 1214A, 1214B, 1214C and the active cell through backside metal layers portion 912C. In the illustrated embodiment of the cross-section, backside metal layers portion 912C is positioned underneath transistor region 1230 in device 1004. Accordingly, backside vias 910A, 910B, 910C in via structures 1010A, 1010B, 1010C provide connections directly downwards into backside metal layers portion 912C for source/drain regions 1214A, 1214B, 1214C, respectively. Control signal route 1200 is then from source/drain regions 1214A, 1214B, 1214C to backside metal layers portion 912C and then to the active cell.

In the illustrated embodiments of FIGS. 12-14, device 1004 is formed in transistor region 1230 of cell 1001. Transistor region 1230 includes structures typically implemented in active layers of devices (such as the adjacent active cell). For example, transistor region 1230 may include gates 1002A-D, gate spacers 1003, and source/drain regions 1214 that are found in active layers of transistor devices. Source/drain regions 1214 may be, for example, doped regions of devices 1004 that form fins or nanosheet stacks in FinFETs or NSH devices.

As described above, in cell 1001, gates 1002A-D and source/drain regions 1214 are not connected to any power source and thus the transistor region 1230 of device 1004 may be considered to be an inactive (e.g., "dummy") transistor region. Because of the inactivity in transistor region 1230 of device 1004, source/drain regions 1214 may be implemented in control signal route 1200, as shown in FIGS. 12-14. Accordingly, as shown in the illustrated embodiments, control signal route 1200 may provide a path between the source/drain regions and gate of an active cell that includes a path through backside metal layers portion 912C, through via structures 1010 (e.g., through backside vias 910, through source/drain regions 1214, and through vias 907), and through topside metal layers portion 908C.

In a typical cell layout, routing from the output of an active cell device (e.g., device 904, shown in FIG. 9, has an output at gate 902A) would go up from the gate and through topside metal layers 908 to an input of a source/drain region in the active cell device. As described herein, such routing may have high resistances that generate RC delay. Control signal route 1200, shown in FIGS. 12-14, however, is a route that includes the additional use of backside metal layers 912 by routing the control signal between topside metal layers portion 908C and backside metal layers portion 912C through structures (e.g. via structures 1010) in cell 1001. Accordingly, in various embodiments, via structures 1010 in cell 1001 provide a route for control signals on a side of an active device (e.g., device 904) opposite from other active devices.

In certain embodiments, cell 1001 includes three via structures 1010A, 1010B, 1010C. As described above, the three via structures 1010A, 1010B, 1010C may be coupled in parallel between topside metal layers portion 908C and backside metal layers portion 912C with the via structures being connected together (e.g., shorted) in the topside metal layers portion and in the backside metal layers portion. Accordingly, control signal route 1200 may "divide" (e.g., split) going from backside metal layers portion 912C to via structures 1010A, 1010B, 1010C and run in parallel through via structures 1010A, 1010B, 1010C. In topside metal layers portion 908C, the control signal may then "recombine" (e.g., combine back together) and connect into a gate in the active cell. It should be noted that while FIGS. 10-14 depict three via structures 1010A, 1010B, 1010C, the number of via structures in cell 1001 may be varied. For example, the number of via structures 1010 may be varied to balance area cost (due to the physical presence of the via structures) versus performance (with more via structures providing higher performance).

Running the control signal through backside metal layers 912 provides a low resistance path for the control signal (e.g., a "highway" path) compared to routing the control signal through only the topside metal layers 908, which have comparatively small metal structures (traces). Thus, transmitting the control signal through backside metal layers 912 and control signal route 1200 reduces the RC delay in transmission of the control signal. It should be noted that the control signal may be routed through any backside metal layer that provides a low resistance path underneath device 904.

As shown in FIGS. 10-14, a control signal may be transmitted to an active device (e.g., device 904) along control signal route 1200. Control signal route 1200 goes through a backside metal layer (e.g., backside metal layers portion 912C) that has low resistance and then in parallel through multiple via structures 1010 before reaching a topside metal layer (e.g., topside metal layers portion 908C). The combination of the low resistance path in the backside metal layer path and the parallel path through via structures 1010 may provide significant reduction in the RC delay for transmitting the control signal to/from device 904, thereby improving the performance of devices in cell layout 1000 compared to previous cell layouts.

One example where providing control signals through both topside and backside metal layers may be useful is an implementation of layout 1000 in a bit cell erase process. In such an embodiment, a bit cell erase signal may be generated at device 904. Device 904 may be pre-charged to provide the bit cell erase signal. With lower interface resistances, the same driver power may drive the bit cell erase signal to greater distances within the layout. For example, device 904 may be capable of sending the bit cell erase signal to a larger group of bit cells (such as 4 bit cells instead of 2 bit cells). As another example, embodiments may be contemplated in which control signals through both topside and backside metal layers to/from device 904 may be implemented to provide a differential structure embodiment in layout 1000. In such embodiments, signals may be routed in parallel to the topside metal layers and the backside metal layers with the signals escaping from the topside on one side of layout 1000 and escaping from the backside on the other side of the layout. The signals may be routed in parallel such that both the topside metal layers and the backside metal layers see a same common mode. Additional cell layouts combining control signal route 1200 with redundant power connections in topside metal layers and backside metal layers may be contemplated to provide improved performance in both signal transmission and power transmission over previous cell layouts.

The above-described embodiments are directed to utilizing backside metal layers to provide additional connections for power and/or control signals in integrated circuit cell layouts. Various embodiments of implementation of these additional connections are also contemplated in the present disclosure. For example, standard memory array (e.g., SRAM array) designs may be contemplated to take advantage of the additional connections for power and/or control signals in the backside metal layers to improve power, performance, and area (PPA) metrics in SRAM arrays. Current designs of SRAM arrays typically provide connections and routing for power or signals to transistors (or other structures) above the transistors. As described herein, some embodiments may be contemplated that have connections to power in the backside metal layers of SRAM arrays (either alone or in combination with topside metal layer power connections).

While providing power connections in the backside metal layers of SRAM arrays provides additional benefits for power transmission, the present disclosure recognizes that additional benefits may be achieved by placing some signal connection paths for bitlines and/or wordlines in backside layers. For instance, moving some signal connection paths for bitlines to backside layers may allow capacitance (cap) reduction on bitlines that improves performance and power utilization in SRAM arrays while moving some signal connection paths for wordlines to backside layers may improve power utilization in SRAM arrays. Further improvements in area cost may also be realized by placing bitlines or wordlines in backside layers.

Certain embodiments disclosed herein have three broad elements: 1) a plurality of bit cells positioned adjacently in an array, 2) a first bitline or a first pair of bitlines spanning alternating bit cells in the array, and 3) a second bitline or a second pair of bitlines spanning every other bit cell from the first bitline or first pair of bitlines. In various embodiments, the first bitline(s) are metal wires located in a first metal layer on a topside (e.g., frontside or above the bit cells) of the device while the second bitline(s) are metal wires located in a second metal layer on the backside (e.g., below the bit cells) of the device. Alternating the first bitline(s) and the second bitline(s) between adjacent bit cells in a memory array may provide significant capacitance reduction in the memory array by providing increased separation between different bitlines in the same metal layers. Reducing the capacitance in the memory array may provide leverage for improving other parameters within the memory array such as leakage, as described herein.

Another embodiment disclosed herein has three broad elements: 1) a plurality of bit cells positioned adjacently in an array, 2) a first wordline spanning the bit cells in the array where the first wordline is a first wire in a first metal layer located above the bit cells, and 3) a second wordline spanning the bit cells in the array where the second wordline is a second wire in a second metal layer located below the bit cells. In various embodiments, the first wordline and the second wordline connect to alternating bit cells within the array. For instance, a memory array may have four adjacent bit cells with both wordlines spanning the four bit cells. The first wordline is connected to the first and third bit cells while the second wordline is connected to the second and fourth bit cells in the memory array.

Alternating the connections between the two separate wordlines may provide independent control of the bit cells. For example, the first wordline controls toggling of the first and third bit cells and the second wordline controls toggling of the second and fourth bit cells. Accordingly, only half the bit cells need to be toggled when a single bit is to be changed instead of toggling all four bit cells, thereby reducing dynamic power consumption in the memory array. Placing wires for wordlines in backside metal layers may also provide an area cost advantage as two wordlines can be placed in a similar vertical area (above/below bit cells) through the two distinct metal layers (e.g., topside and backside metal layers), thereby doubling the wordline capacity without any area cost.

In short, the present inventors have recognized that wiring in backside metal layers may be advantageously implemented in memory arrays (e.g., SRAM arrays). Utilizing the wiring in backside metal layers for bitline and/or wordline routing may provide various PPA improvements in memory arrays. For instance, performance and power improvements may be provided by reducing bitline capacitance, which can additionally be leveraged for other improvements in memory arrays including area reduction opportunities.

Figure 15:
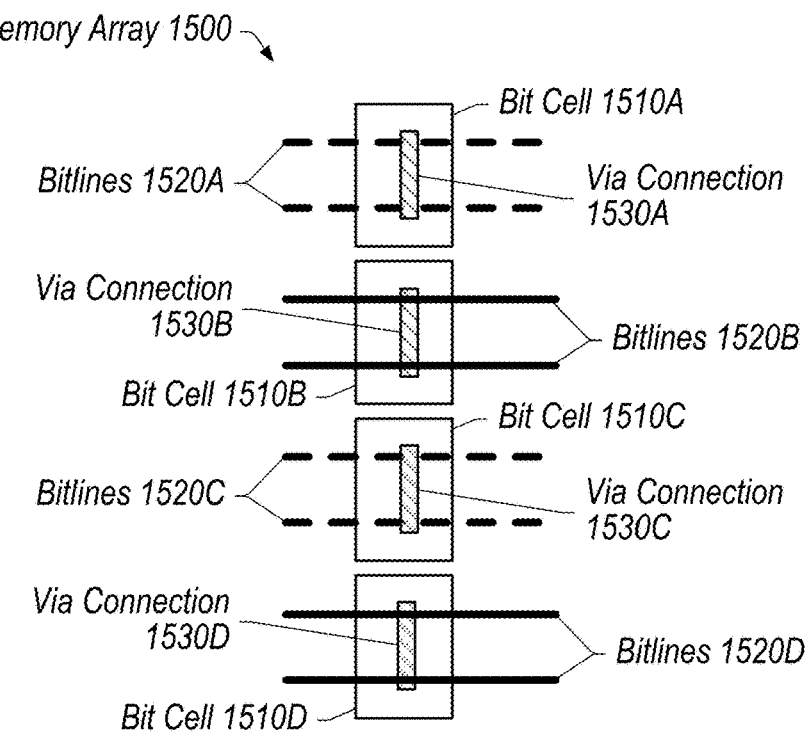
FIG. 15 depicts a top-view representation of a memory array showing bit cells and bitlines, according to some embodiments.

FIG. 15 depicts a top-view representation of memory array 1600 showing bit cells and bitlines, according to some embodiments. In the illustrated embodiment, memory array 1600 includes four bit cells—bit cell 1610A, bit cell 1510B, bit cell 1510C, and bit cell 1510D. While four bit cells are depicted in FIG. 15, it should be understood that memory array 1500 may include any number of bit cells. In various embodiments, bit cell 1510A, bit cell 1510B, bit cell 1510C, and bit cell 1510D are adjacently positioned (e.g., positioned next to each other) in memory array 1500. For instance, as depicted in FIG. 15, bit cells 1510A-D are positioned vertically adjacent to one another (e.g., vertically "stacked" on top of each other).

In certain embodiments, memory array 1500 includes pairs of bitlines spanning each bit cell 1510. For instance, in the illustrated embodiment, bitlines 1520A span bit cell 1510A, bitlines 1520B span bit cell 1510B, bitlines 1520C span bit cell 1510C, and bitlines 1520D span bit cell 1510D. Each pair of bitlines may be a complementary pair of bitlines (e.g., one bitline is a positive bitline and the other bitline is a negative bitline). In various embodiments, bitlines 1520 run perpendicular to the direction that bit cells 1510 are positioned adjacently (e.g., the direction bit cells 1510A-D are stacked in FIG. 15). In certain embodiments, bitlines 1520 are wires (e.g., metal routes, metal traces, metal structures, etc.) formed in metal layers of a memory device.

In certain embodiments, bitlines 1520 (e.g., the wires in the bitlines) are connected to their respective bit cells 1510 by via connections 1530. For example, in the illustrated embodiment, bitlines 1520A are connected to bit cell 1510A by via connection 1530A, bitlines 1520B are connected to bit cell 1510B by via connection 1530B, bitlines 1520C are connected to bit cell 1510C by via connection 1530C, and bitlines 1520D are connected to bit cell 1510D by via connection 1530D. It is noted that while via connections 1530 are depicted in FIG. 15 as spanning the pairs of bitlines that each wire in a bitline pair may have its own individual via connection. Thus, via connections 1530A-D may each include more than one via connection. Additionally, in embodiments with multiple via connections 1530 in a single bit cell, the via connections may be aligned or offset within the bit cell as required by design rules.

The present disclosure contemplates placing different pairs of bitlines 1520 in different metal layers on the topside and the backside of bit cells 1510, as shown in FIG. 15, to improve PPA over typical SRAM arrays. In the illustrated embodiment, bitlines 1520A and bitlines 1520C are wires in backside metal layers of memory array 1500 (e.g., metal layers below the transistor regions of bit cell 1510A and bit cell 1510C). Conversely, bitlines 1520B and bitlines 1520D are wires in topside metal layers of memory array 1500 (e.g., metal layers above the transistor regions of bit cell 1510B and bit cell 1510D). Thus, as shown in FIG. 15, the bitlines are alternated between the backside metal layers and the topside metal layers in adjacent bit cells. For example, bitlines 1520A in bit cell 1510A are in a backside metal layer, then bitlines 1520B in bit cell 1510B switch to a topside metal layer with bitlines 1520C in bit cell 1510C switch back to the backside metal layer, and then bitlines 1520D in bit cell 1510D switch back to the topside metal layer.

In various embodiments, bitlines 1520 may be placed in topside or backside metal layers using the techniques described herein. It should be noted that bitlines 1520 may be placed in backside metal layers without needing a gate connection as bitlines connect to drains in memory array 1500. Additional embodiments may be contemplated where each pair of bitlines includes one bitline in the topside metal layer and one bitline in the backside metal layer. In such embodiments, additional design considerations may be implemented to maintain symmetry between the bitlines in each pair of bitlines.

Figure 16:
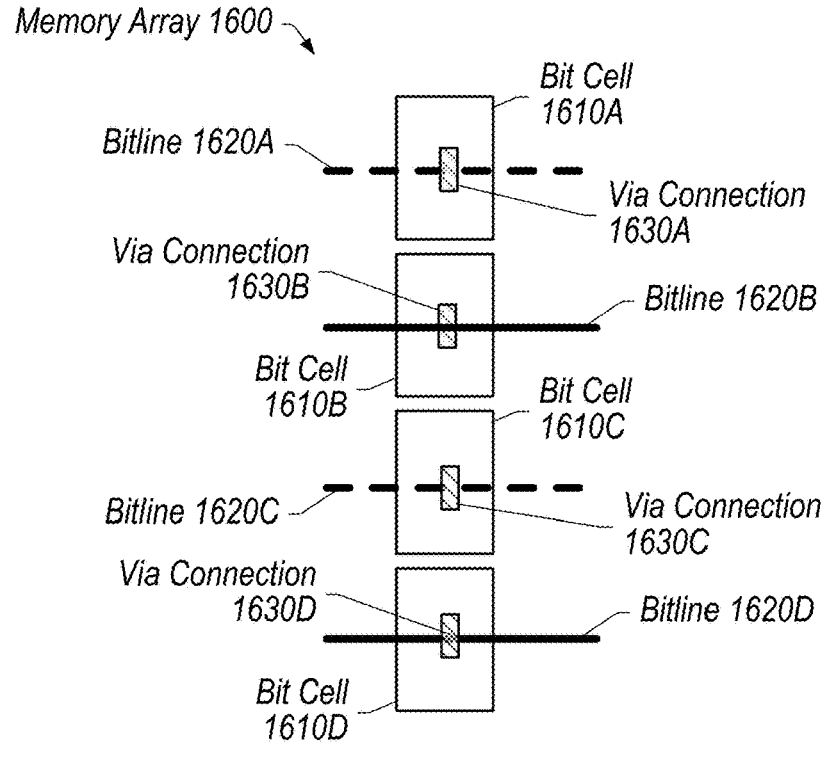
FIG. 16 depicts a top-view representation of a memory array with single-ended bitlines in bit cells, according to some embodiments.

In some embodiments of memory arrays, single-ended bitlines in bit cells may be contemplated. FIG. 16 depicts a top-view representation of memory array 1600 with single-ended bitlines in bit cells, according to some embodiments. In the illustrated embodiment, memory array 1600 includes bit cells 1610A-D with single bitlines 1620A-D spanning the bit cells. Similar to the embodiment of FIG. 15, bitlines 1620A-D may be alternated between the backside and topside metal layers between adjacent bit cells 1610A-D. While four bit cells are depicted in FIG. 16, it should be understood that memory array 1600 may include any number of bit cells. In various embodiments, via connections 1630A-D provide connections between bitlines 1620A-D and their respective bit cells 1610A-D.

In typical SRAM arrays, bitlines are wires in metal layers on the topside (e.g., frontside) of bit cells (e.g., the bitlines are in metal layers above the transistor regions of the bit cells). Placing bitlines in the same metal layer may, however, require high shielding requirements between bitlines, thereby increasing bitline capacitance in a memory array and reducing performance of the memory array.

In the present disclosure, alternating bitlines between the backside and topside metal layers in adjacent bit cells, as shown in FIGS. 15 and 16, reduces the bitline capacitance in the memory array. For instance, alternating the bitlines creates higher separation distance between bitlines (or pairs of bitlines) in the same metal layer. This increased separation distance reduces the shielding requirements for bitlines and reduces the bitline capacitance. Reducing the bitline capacitance may further be leveraged in other characteristics of the memory array. For instance, with lower shielding requirements area utilization by shielding structures may be reduced, thereby increasing area availability in the memory array for other structures. As another example, the bit cells in the memory array may be slowed down with the reduction in bitline capacitance while providing the same performance. Slowing down the bit cells may reduce leakage in the memory array.

FIG. 17 depicts a top-view representation of memory array 1700 showing bit cells and wordlines, according to some embodiments. In the illustrated embodiment, memory array 1700 includes four bit cells—bit cell 1710A, bit cell 1710B, bit cell 1710C, and bit cell 1710D. While four bit cells are depicted in FIG. 17, it should be understood that memory array 1700 may include any number of bit cells. In various embodiments, bit cell 1710A, bit cell 1710B, bit cell 1710C, and bit cell 1710D are adjacently positioned (e.g., positioned next to each other) in memory array 1700. For instance, as depicted in FIG. 17, bit cells 1710A-D are positioned vertically adjacent to one another (e.g., vertically "stacked" on top of each other).

In certain embodiments, memory array 1700 includes a pair of parallel wordlines, wordline 1720A and wordline 1720B spanning across bit cells 1710A-D. Thus, wordline 1720A and wordline 1720B may be considered to span memory array 1700. In various embodiments, wordline 1720A and wordline 1720B span bit cells 1710A-D in the same direction that the bit cells are adjacently positioned (e.g., in the vertical direction depicted in FIG. 17). Accordingly, wordlines 1720A and 1720B provide access to bit cells 1710A-D across memory array 1700 along their lengths. In certain embodiments, wordline 1720A is a wire in a backside metal layer of memory array 1700 while wordline 1720B is a wire in a topside metal layer of the memory array. Placing wordline 1720A in the backside metal layer and wordline 1720B in the topside metal layer allows two wordlines to be positioned over the same group of bit cells (e.g., bit cells 1710A-D) in memory array 1700. Placing two wordlines over the same group of bit cells provides area utilization advantages, as described below.

As shown in FIG. 17, access (e.g., connection) to bit cells 1710A-D is provided by via connections 1730A-D. Via connections 1730 may be, for example, metal vias through insulating layers positioned between the transistor regions containing bit cells 1710 and the metal layers containing wordlines 1720. In various embodiments, via connections 1730A-D selectively provide connections between bit cells 1710A-D and either wordline 1720A or wordline 1720B as the wordlines pass through the bit cells. In certain embodiments, connections to bit cells 1710A-D are alternated between wordline 1720A and wordline 1720B for adjacent bit cells by alternating the connections provided by via connections 1730A-D. For example, in the illustrated embodiment, via connection 1730A provides connection between bit cell 1710A and wordline 1720B, via connection 1730B then provides connection between bit cell 1710B and wordline 1720A, via connection 1730C then provides connection between bit cell 1710C and wordline 1720B, and the via connection 1730D provides connection between bit cell 1710D and wordline 1720A. Thus, connections to wordline 1720A in bit cells 1710B and 1710D are alternated with connections to wordline 1720B in bit cells 1710A and 1710C.

In typical SRAM arrays, only a single wordline in a topside layer is available for an array of adjacent bit cells. For instance, only a single wordline is allowed to be implemented in a topside metal layer as there is insufficient area to place two parallel wordlines that span the multiple vertical (as illustrated) bit cells. With a single wordline, when an instruction (e.g., control signal) is provided to toggle a single bit cell, all the bit cells along the wordline receive the instruction to toggle. Since all the bit cells are toggled, power consumption is unnecessarily increased over toggling only a select number of bit cells.

In various embodiments, wordlines 1720 are placed in topside or backside metal layers using the techniques described herein. It should be noted that wordlines 1720 placed in backside metal layers typically require a gate connection (e.g., to a pass gate). Accordingly, embodiments may be contemplated where connections to the gate through backside layers described herein are implemented for wordlines 1720.

In the present disclosure, the placement of wordlines in both topside and backside metal layers may allow connections to bit cells to be alternated between parallel wordlines that simultaneously provide access to the same group of bit cells. For instance, as shown in FIG. 17, wordline 1720A (in a backside metal layer) and wordline 1720B (in a topside metal layer have alternating connections to adjacent bit cells 1710 in memory array 1700. Accordingly, a single wordline (e.g., either wordline 1720A or wordline 1720B) is able to provide a control signal to a reduced number of bit cells 1710 in memory array 1700 (e.g., half the bit cells). For example, when a control signal to toggle is sent through wordline 1720A, only bit cell 1710A and bit cell 1710C are toggled while bit cell 1710B and bit cell 1710D remain in their current state. Similarly, when a control signal to toggle is sent through wordline 1720B, only bit cell 1710B and bit cell 1710D are toggled while bit cell 1710A and bit cell 1710C remain in their current state.

Reducing the number of bit cells toggled by a single control signal may reduce dynamic power consumption in memory array 1700 compared to memory arrays that have a single wordline. Providing the reduced dynamic power consumption also comes at a low area cost as the wordline count is doubled in a vertical area above the bit cells instead of needing to increase the area of the bit cells to accommodate multiple wordlines. The embodiment of the technique described in FIG. 17 for doubling wordlines may also be applied to other control signal lines implemented in an integrated circuit such as a memory array. For example, control signals such as, but not limited to, bitline precharge signals, column select signals, cross-coupled PMOS structure signals are control signals that may take advantage of the doubling of lines in the topside and backside metal layers. Applying the disclosed technique to these control signals may further reduce power as these signals are full power signals unlike wordline control signals.

Various embodiments of memory arrays may also be contemplated that take advantage of placing both bitlines and wordlines in topside and backside metal layers. FIG. 18 depicts a top-view representation of memory array 1800 with both bitlines and wordlines in topside and backside metal layers, according to some embodiments. In the illustrated embodiment, memory array 1800 includes four bit cells—bit cell 1810A, bit cell 1810B, bit cell 1810C, and bit cell 1810D. While four bit cells are depicted in FIG. 18, it should be understood that memory array 1800 may include any number of bit cells. In various embodiments, bit cell 1810A, bit cell 1810B, bit cell 1810C, and bit cell 1810D are adjacently positioned (e.g., positioned next to each other) in memory array 1800. For instance, as depicted in FIG. 18, bit cells 1810A-D are positioned vertically adjacent to one another (e.g., vertically "stacked" on top of each other).

The illustrated embodiment of memory array 1800 essentially includes the bitlines of memory array 1500, shown in FIG. 15, overlapped with the wordlines of memory array 1700, shown in FIG. 17. Accordingly, memory array 1800 includes bitlines 1820A spanning bit cell 1810A, bitlines 1820B spanning bit cell 1810B, bitlines 1820C spanning bit cell 1810C, and bitlines 1820D spanning bit cell 1810D. Memory array 1800 further includes wordlines 1830A and 1830B spanning bit cells 1810A-D.

As described in earlier embodiments, bitlines 1820A-D may include pairs of bitlines in either a topside metal layer or a backside metal layer. For example, in the illustrated embodiment, bitlines 1820A and bitlines 1820C are in a backside metal layer and bitlines 1820B and bitlines 1820D are in a topside metal layer. Similarly, wordline 1830A may be in a backside metal layer while wordline 1830B is in a topside metal layer. Via connections 1840A-D then provide alternating connections to wordline 1830A and wordline 1830B from bit cells 1810A-D while via connections 1850A-D provide alternating connections between bitlines 1820A-D and bit cells 1810A-D, as described herein.

It should be understood that while bitlines 1820 and wordlines 1830 are shown crossing each other and both are described as being "in a backside (or topside) metal layer", the bitlines and wordlines may be implemented in different metal layers in both the topside and backside layers. For instance, bitlines 1820A may be implemented in a first metal layer in the backside metal layers while wordline 1830A is implemented in a second metal layer in the backside metal layers. Additional embodiments may be contemplated where the bitlines and wordlines are routed through multiple metal layers to accommodate spacing between the lines. The embodiment of memory array 1800, depicted in FIG. 18, may benefit from the various advantages described herein related to having both bitlines and wordlines simultaneously in backside and topside metal layers.

Figure 19:
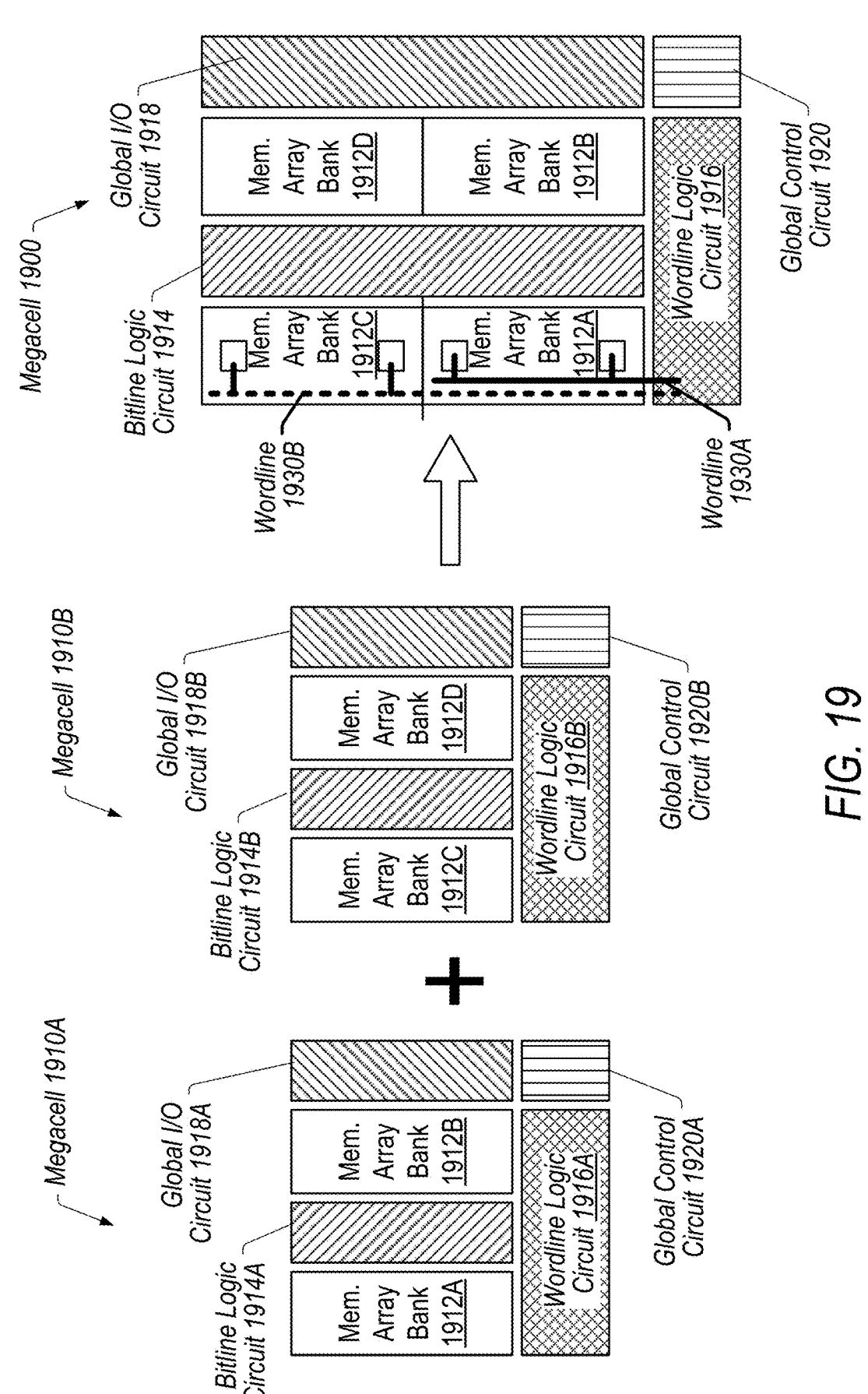
FIG. 19 depicts a top-view representation of a large memory megacell replacing two smaller memory megacells, according to some embodiments.

In various embodiments, wordlines in both topside and backside metal layers may be implemented in large cells (e.g., "megacells") of memory arrays to improve area utilization in such cells. FIG. 19 depicts a top-view representation of a large memory megacell replacing two smaller memory megacells, according to some embodiments. In the illustrated embodiment, megacells 1910A and 1910B are combined into a single megacell, megacell 1900. Megacell 1910A includes memory array bank 1912A and memory array bank 1912B separated by bitline logic circuit 1914A with wordline logic circuit 1916A positioned adjacent to the memory array banks and the bitline logic circuit. Memory array banks 1912A and 1912B may include any of the various memory cells or memory arrays disclosed herein in addition to other contemplated embodiments of memory cells and memory arrays. Bitline logic circuit 1914A may include sense amplifiers or other logic for reading data from memory array banks 1912A and 1912B. Wordline logic circuit 1916A may include wordline decoder logic, wordline select logic, or multiplexor logic for interaction with wordlines in memory array banks 1912A and 1912B.

In various embodiments, megacell 1910A also includes global input/output (I/O) circuit 1918A and global control circuit 1920A. Global I/O circuit 1918A may include, for example, write drivers or sense amplifiers. Global control circuit 1920A may include, for example, clocks or decoder logic. Megacell 1910B may be similar to megacell 1910A by including memory array bank 1912C, memory array bank 1912D, bitline logic circuit 1914B, wordline logic circuit 1916B, global input/output (I/O) circuit 1918B, and global control circuit 1920B.

As shown by the arrow in FIG. 19, megacells 1910A and 1910B may be combined to form megacell 1900. Megacell 1900 includes memory array banks 1912A-D with single instances of bitline logic circuit 1914, wordline logic circuit 1916, global input/output (I/O) circuit 1918, and global control circuit 1920. Accordingly, megacell 1900 may have a reduced area cost compared to the combination of megacells 1910A and 1910B.

Megacell 1900 may be formed by implementing wordlines in both a topside metal layer and a backside metal layer. For instance, in the illustrated embodiment, megacell 1900 includes wordline 1930A and wordline 1930B for connecting to memory array bank 1912A and memory array bank 1912C, respectively. Similar wordlines may be provided to memory array banks 1912B and 1912D.

In certain embodiments, wordline 1930A is located in a topside metal layer while wordline 1930B is located in a backside metal layer. As shown in FIG. 19, wordline 1930B has a longer distance to travel to connect to memory cells in memory array bank 1912C than wordline 1930A has to travel to connect to memory cells in memory array bank 1912A. Because of this longer distance, wordline 1930B may be placed in the backside metal layer as the backside metal layer typically has lower resistance metal wiring than topside metal layers. Using the low resistance backside metal layer for wordline 1930B also eliminates the need for repeaters that might be required for a topside metal layer wordline connecting to memory array bank 1912C or memory array bank 1912D. Accordingly, megacell 1900 provides better utilization of area and better performance and power metrics compared to the combination of megacells 1910A and 1910B.

Figure 20:
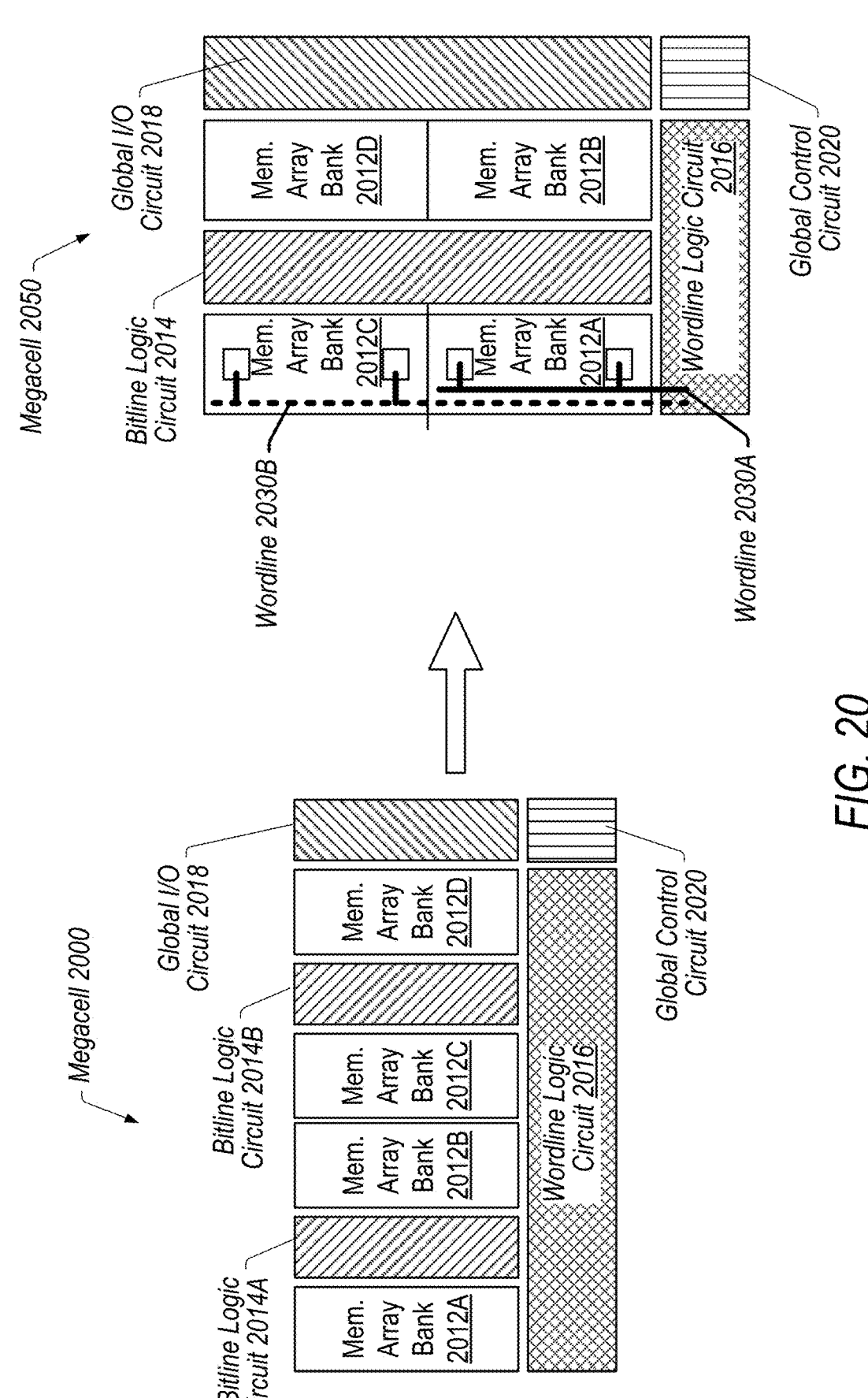
FIG. 20 depicts a top-view representation of a tall memory megacell replacing a wide memory megacell, according to some embodiments.

In various embodiments, a wide memory megacell may that has a large area cost may be converted to a taller, narrower memory megacell to reduce the area requirements. FIG. 20 depicts a top-view representation of a tall memory megacell replacing a wide memory megacell, according to some embodiments. In the illustrated embodiment, megacell 2000 is a wide memory megacell. Megacell 2000 includes memory array bank 2012A, memory array bank 2012B, memory array bank 2012C, and memory array bank 2012D. Memory array bank 2012A and memory array bank 2012B are separated by and connected with bitline logic circuit 2014A while memory array bank 2012C and memory array bank 2012D are separated by and connected with bitline logic circuit 2014B.

Megacell 2000 includes single instances of wordline logic circuit 2016 (that integrates with each of memory array banks 2012A-D), global I/O circuit 2018, and global control circuit 2020. As shown in FIG. 20, megacell 2000 may be converted to megacell 2050. Megacell 2050 may have a similar structure to memory array 1800, shown in FIG. 18 with memory array banks 2012A-D and single instances of bitline logic circuit 2014, wordline logic circuit 2016, global I/O circuit 2018, and global control circuit 2020.

The conversion to megacell 2050 may be provided by implementing wordlines in both a topside metal layer and a backside metal layer, similar to memory array 1800. For instance, in the illustrated embodiment, megacell 2050 includes wordline 2030A in a topside metal layer for connecting to memory array bank 2012A and wordline 2030B in a backside metal layer for connecting to memory array bank 2012C. Accordingly, megacell 2050 provides better utilization of area and better performance and power metrics compared to megacell 2000. Additional area savings are also found in megacell 2050 with the reduced width of wordline logic circuit 2016 compared to megacell 2000.

Figure 21:
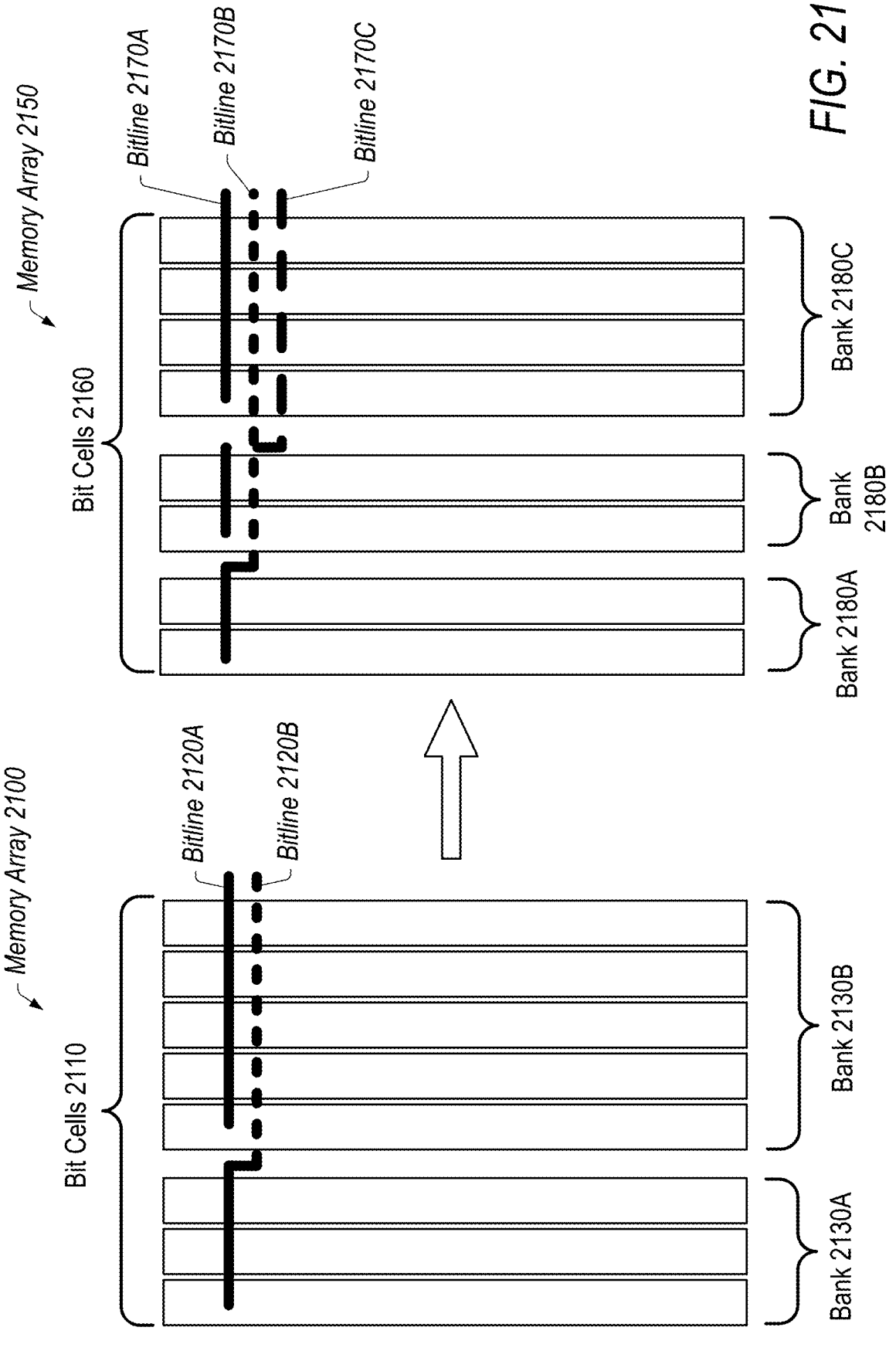
FIG. 21 depicts a top-view representation of memory arrays with hierarchical bitlines, according to some embodiments.

Based on the present disclosure of bitline implementation in both topside and backside metal layers, various embodiments of hierarchical bitline layouts may also be contemplated. FIG. 21 depicts a top-view representation of memory arrays with hierarchical bitlines, according to some embodiments. In the illustrated embodiment, memory array 2100 is a memory array with bitlines spanning bit cells 2110 in two topside metal layers. For instance, bitline 2120A may be in a first metal layer while bitline 2120B is in a second metal layer.

Hierarchical routing of bitlines may be implemented by jumping from bitline 2120A to bitline 2120B at the transition between bit cell bank 2130A and bit cell bank 2130B, as shown in FIG. 21. Bit cells 2110 in bit cell banks 2130 may share resources (such as sense amplifiers) to reduce bitline capacitance for large caches of data (e.g., caches with 512 wordlines). Sharing of resources may also reduce the number of local I/O connections needed in memory array 2100.

The addition of bitline routing in a backside metal layer may provide additional reduction in bitline capacitance. For example, memory array 2150 includes three bitlines 2170A, 2170B, 2170C spanning bit cells 2160. Bitline 2170A is in a first metal layer in the backside metal layers while bitline 2170B is in a first metal layer and bitline 2170C is in a second metal layer in the topside metal layers. Thus, three bit cell banks 2180A, 2180B, and 2180C may be generated by the hierarchy of bitlines 2170A, 2170B, 2170C.

Example Computer System

Figure 22:
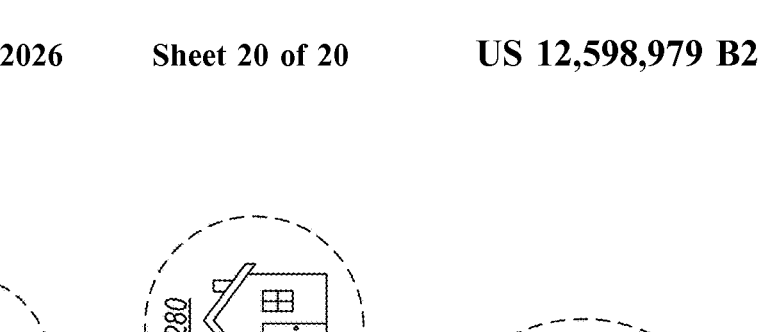
FIG. 22 is a block diagram of one embodiment of an example system.

Turning next to FIG. 22, a block diagram of one embodiment of a system 2200 is shown that may incorporate and/or otherwise utilize the methods and mechanisms described herein. In the illustrated embodiment, the system 2200 includes at least one instance of a system on chip (SoC) 2206 which may include multiple types of processing units, such as a central processing unit (CPU), a graphics processing unit (GPU), or otherwise, a communication fabric, and interfaces to memories and input/output devices. In some embodiments, one or more processors in SoC 2206 includes multiple execution lanes and an instruction issue queue similar to. In various embodiments, SoC 2206 is coupled to external memory 2202, peripherals 2204, and power supply 2208.

A power supply 2208 is also provided which supplies the supply voltages to SoC 2206 as well as one or more supply voltages to the memory 2202 and/or the peripherals 2204. In various embodiments, power supply 2208 represents a battery (e.g., a rechargeable battery in a smart phone, laptop or tablet computer, or other device). In some embodiments, more than one instance of SoC 2206 is included (and more than one external memory 2202 is included as well).

The memory 2202 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 2204 include any desired circuitry, depending on the type of system 2200. For example, in one embodiment, peripherals 2204 includes devices for various types of wireless communication, such as Wi-Fi, Bluetooth, cellular, global positioning system, etc. In some embodiments, the peripherals 2204 also include additional storage, including RAM storage, solid state storage, or disk storage. The peripherals 2204 include user interface devices such as a display screen, including touch display screens or multitouch display screens, keyboard or other input devices, microphones, speakers, etc.

As illustrated, system 2200 is shown to have application in a wide range of areas. For example, system 2200 may be utilized as part of the chips, circuitry, components, etc., of a desktop computer 2210, laptop computer 2220, tablet computer 2230, cellular or mobile phone 2240, or television 2250 (or set-top box coupled to a television). Also illustrated is a smartwatch and health monitoring device 2260. In some embodiments, smartwatch may include a variety of general-purpose computing related functions. For example, smartwatch may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 2200 may further be used as part of a cloud-based service(s) 2270. For example, the previously mentioned devices, and/or other devices, may access computing resources in the cloud (i.e., remotely located hardware and/or software resources). Still further, system 2200 may be utilized in one or more devices of a home 2280 other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 22 is the application of system 2200 to various modes of transportation 2290. For example, system 2200 may be used in the control and/or entertainment systems of aircraft, trains, buses, cars for hire, private automobiles, waterborne vessels from private boats to cruise liners, scooters (for rent or owned), and so on. In various cases, system 2200 may be used to provide automated guidance (e.g., self-driving vehicles), general systems control, and otherwise. These any many other embodiments are possible and are contemplated. It is noted that the devices and applications illustrated in FIG. 22 are illustrative only and are not intended to be limiting. Other devices are possible and are contemplated.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation— [entity] configured to [perform one or more tasks] is used herein to refer to structure something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement, The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

What is claimed is:

1. An apparatus, comprising:
   a substrate;
   a transistor having a gate region, a source region, and a drain region located above the substrate in a vertical dimension perpendicular to the substrate;
   a first metal layer located above the transistor in the vertical dimension;
   a second metal layer located below the transistor in the vertical dimension;
   a first via providing a connection between the source region and the first metal layer;
   a second via providing a connection between the source region and the second metal layer;
   a first rail connected to both the first and second metal layers;
   a second rail connected to both the first and second metal layers; and
   wherein the source region is coupled to at least one of the first rail and the second rail through both the first and second metal layers.

2. The apparatus of claim 1, wherein the first metal layer is positioned on a topside of the substrate.

3. The apparatus of claim 1, wherein the second metal layer is positioned on a backside of the substrate.

4. The apparatus of claim 1, wherein the first rail and the second rail are power rails connected to one or more power supplies.

5. The apparatus of claim 1, wherein the first rail and the second rail are signal rails for the source region.

6. The apparatus of claim 1, wherein the source region is coupled to the first rail through the first via and the first metal layer and through the second via and the second metal layer.

7. The apparatus of claim 1, further comprising:
   a third via providing a connection between the drain region and the first metal layer; and
   a fourth via providing a connection between the drain region and the second metal layer.

8. The apparatus of claim 7, wherein the drain region is coupled to the second rail through the third via and the first metal layer and through the fourth via and second metal layer.

9. The apparatus of claim 1, further comprising at least one via that couples the gate region to at least one of the first metal layer and the second metal layer.

10. The apparatus of claim 1, wherein the source region and the drain region are positioned on opposing sides of the gate in a horizontal dimension orthogonal to the vertical dimension.

11. The apparatus of claim 1, wherein the first via provides the connection in the vertical dimension between the source region and the first metal layer.

12. The apparatus of claim 1, wherein the second via provides the connection in the vertical dimension between the source region and the second metal layer.

13. An apparatus, comprising:

a substrate;

a transistor having a gate region, a source region, and a drain region located above the substrate in a vertical dimension perpendicular to the substrate;

a first metal layer located above the transistor in the vertical dimension;

a second metal layer located below the transistor in the vertical dimension;

a first via providing a connection between the source region and the first metal layer;

a second via providing a connection between the source region and the second metal layer;

a first rail connected to both the first and second metal layers;

a second rail connected to both the first and second metal layers;

wherein the source region is coupled to the first rail through both the first and second metal layers; and wherein the drain region is coupled to the second rail through both the first and second metal layers.

14. The apparatus of claim 13, wherein the source region is coupled to a power supply providing a supply voltage through both the first metal layer and the second metal layer.

15. The apparatus of claim 14, wherein the source region receives a first portion of a current from the power supply through the first metal layer and a second portion of the current through the second metal layer, the first portion of the current and the second portion of the current being determined based on resistances of the first metal layer and the second metal layer.

16. The apparatus of claim 13, wherein the first metal layer includes power routing coupled to the first rail and ground routing coupled to the second rail, and wherein the source region is coupled to the power routing in the first metal layer and the drain region is coupled to the ground routing in the first metal layer.

17. The apparatus of claim 13, wherein the second metal layer includes power routing coupled to the first rail and ground routing coupled to the second rail, and wherein the source region is coupled to the power routing in the second metal layer and the drain region is coupled to the ground routing in the second metal layer.

18. The apparatus of claim 13, wherein the source region and the drain region are positioned on opposing sides of the gate in a horizontal dimension orthogonal to the vertical dimension.

19. The apparatus of claim 13, wherein the first via provides the connection between in the vertical dimension the source region and the first metal layer.

20. The apparatus of claim 13, wherein the second via provides the connection in the vertical dimension between the source region and the second metal layer.

* * * * *